(12) United States Patent
Wu et al.

(10) Patent No.: US 12,342,594 B2
(45) Date of Patent: Jun. 24, 2025

(54) SEMICONDUCTOR STRUCTURE AND METHOD FOR FABRICATING SEMICONDUCTOR STRUCTURE

(71) Applicant: CHANGXIN MEMORY TECHNOLOGIES, INC., Hefei (CN)

(72) Inventors: Tieh-Chiang Wu, Hefei (CN); Lingxin Zhu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 432 days.

(21) Appl. No.: 17/844,736

(22) Filed: Jun. 21, 2022

(65) Prior Publication Data

US 2022/0344482 A1    Oct. 27, 2022

Related U.S. Application Data

(63) Continuation of application No. PCT/CN2021/112261, filed on Aug. 12, 2021.

(30) Foreign Application Priority Data

Apr. 21, 2021    (CN) .......................... 202110431233.7

(51) Int. Cl.
    *H10D 64/23*    (2025.01)
    *H01L 23/485*   (2006.01)
    (Continued)

(52) U.S. Cl.
    CPC ........... *H10D 64/258* (2025.01); *H10D 64/01* (2025.01); *H10D 64/62* (2025.01)

(58) Field of Classification Search
    CPC ............ H01L 29/41775; H01L 29/401; H01L 23/5222; H01L 23/485; H01L 2924/30105
    See application file for complete search history.

(56) References Cited

U.S. PATENT DOCUMENTS 9,196,699 B1    11/2015  Hsu et al.
9,997,633 B2 *  6/2018   Hsiao ................ H01L 29/66545
(Continued)

FOREIGN PATENT DOCUMENTS

CN    106560931 A    4/2017
CN    111129148 A    5/2020
JP    2009032982 A    2/2009

*Primary Examiner* — Joshua Benitez Rosario
*Assistant Examiner* — Moataz Khalifa
(74) *Attorney, Agent, or Firm* — Kilpatrick Townsend & Stockton LLP

(57) ABSTRACT

Embodiments provide a semiconductor structure and a method for fabricating a semiconductor structure. The semiconductor structure includes: a source region and a drain region arranged at intervals on a substrate; a gate oxide layer arranged between the source region and the drain region; a gate structure arranged on the gate oxide layer; and a conductive plug arranged at a corresponding location of the source region and a corresponding location of the drain region. The gate structure includes a conductive layer having a recessed side surface facing toward the conductive plug. Compared with a traditional gate structure, in the solutions of the present disclosure, a distance between the conductive layer having the recessed side surface and the conductive plug is increased, thereby reducing a parasitic capacitance between the gate structure and the conductive plug, such that capacitances between a gate and the source/drain region are reduced, and device characteristics are improved.

9 Claims, 14 Drawing Sheets

(51) Int. Cl.
*H10D 30/69* (2025.01)
*H10D 64/01* (2025.01)
*H10D 64/27* (2025.01)
*H10D 64/62* (2025.01)
*H10D 64/66* (2025.01)

(56) References Cited

U.S. PATENT DOCUMENTS

| | | |
|---|---|---|
| 10,811,519 B2 | 10/2020 | Huang et al. |
| 2007/0114616 A1 | 5/2007 | Manger et al. |
| 2020/0365697 A1 | 11/2020 | Li et al. |

* cited by examiner

US 12,342,594 B2

SEMICONDUCTOR STRUCTURE AND METHOD FOR FABRICATING SEMICONDUCTOR STRUCTURE

CROSS-REFERENCE TO RELATED APPLICATION

This application is a continuation of PCT/CN2021/112261, filed on Aug. 12, 2021, which claims priority to Chinese Patent Application No. 202110431233.7 titled "SEMICONDUCTOR STRUCTURE AND METHOD FOR FABRICATING SEMICONDUCTOR STRUCTURE" and filed to the State Intellectual Property Office on Apr. 21, 2021, the entire contents of which are incorporated herein by reference.

TECHNICAL FIELD

The present disclosure relates to but is not limited to a semiconductor structure and a method for fabricating a semiconductor structure.

BACKGROUND

A semiconductor transistor generally includes a gate positioned on a substrate and a source region and a drain region positioned in a surface of the substrate. Generally, the source region and the drain region of the transistor are correspondingly provided with a conductive plug. The conductive plug is configured to connect the transistor with other semiconductor devices to implement functions of the transistor.

A variety of capacitances may exist in the above transistor, which may have a negative effect on characteristics of the transistor, particularly the capacitances between the gate and the source region and the capacitances between the gate and the drain region generally may have a negative effect on high-frequency characteristics of the transistor.

Therefore, there is an urgent need for a solution that can reduce the capacitances between the gate and the source/drain region of semiconductor transistor.

SUMMARY

Embodiments of the present disclosure provide a semiconductor structure and a method for fabricating a semiconductor structure.

The embodiments of the present disclosure provide a semiconductor structure, which includes: a source region and a drain region arranged at intervals on a substrate; a gate oxide layer arranged between the source region and the drain region; a gate structure arranged on the gate oxide layer; and a conductive plug arranged at a corresponding location of the source region and a corresponding location of the drain region. The gate structure includes a conductive layer having a recessed side surface facing toward the conductive plug.

The embodiments of the present disclosure provide a method for fabricating a semiconductor structure. The method includes: forming a gate oxide layer; forming a gate structure on the gate oxide layer; forming a source region and a drain region on two sides of the gate structure; and forming a conductive plug at a corresponding location of the source region and a corresponding location of the drain region, respectively. The gate structure comprises a conductive layer having a recessed side surface facing toward the conductive plug.

REFERENCE NUMBERS IN THE ACCOMPANYING DRAWINGS

Figure 1A:
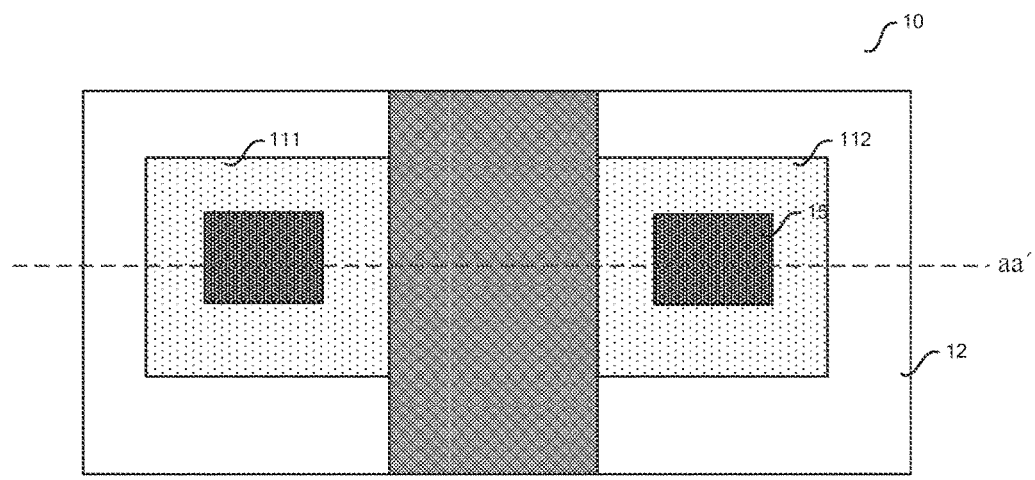
FIG. 1a and FIG. 1B illustrate a typical semiconductor transistor structure.

10: existing semiconductor structure;
111: source region;
112: drain region;
12: substrate;
13: gate oxide layer;
14: gate structure;
15: conductive plug;
16: conductive layer;
20: semiconductor structure;
211: source region;
212: drain region;
22: substrate;
23: gate oxide layer;
24: gate structure;
25: conductive plug;
251: metal plug;
252: barrier layer;
253: metal silicide;

26: conductive layer having a recessed side surface;
31: second dielectric layer;
32: contact hole;
33: side isolation structure;
331: first isolation sidewall;
332: second isolation sidewall;
333: spacer medium;
34: lightly-doped region;
40: semiconductor structure;
411: source region;
412: drain region;
42: substrate;
43: gate oxide layer;
44: gate structure;
441: first conductive layer;
442: second conductive layer;
45: conductive plug;
46: metal layer having a recessed side surface;
50: semiconductor structure;
511: source region;
512: drain region;
52: substrate;
53: gate oxide layer;
54: gate structure;
541: first dielectric layer;
55: conductive plug;
56: metal layer having a recessed side surface;
711: source region;
712: drain region;
72: substrate;
73: gate oxide layer;
74: gate structure;
741: first conductive layer;
742: second conductive layer;
75: conductive plug;
751: metal plug;
752: barrier layer;
753: metal silicide;
76: metal layer having a recessed side surface;
911: source region;
912: drain region;
92: substrate;
93: gate oxide layer;
94: gate structure;
941: first conductive layer;
942: second conductive layer;
945: protection layer;
95: conductive plug; and
96: predetermined metal layer.
1004: gate structure;
1041: first dielectric layer; and
1042: third conductive layer.

Some embodiments of the present disclosure are shown by the above drawings, and more detailed description will be made hereinafter. These drawings and text description are not for limiting the scope of conceiving the present disclosure in any way, but for illustrating the concept of the present disclosure for those skilled in the art by referring to particular embodiments.

DETAILED DESCRIPTION

The terms "comprising" and "having" in the present disclosure are intended to be inclusive and specify the presence of other elements/constituent parts or the like excluding the elements/constituent parts listed out. The terms "first" and "second" and so on are merely for marker purposes, and do not impose numerical limitations on objects thereof. In the present disclosure, location terms such as "up, down, left, right" are used to refer generally to up, down, left, right as shown with reference to the drawings, without explanation to the contrary. "Inside and outside" refer to the inside and outside with respect to a contour of each component itself. It is to be understood that the above location terms denote relative terms and are used in this specification for convenience only. For example, according to the direction of the example described in the drawings, if the device of the icon is flipped upside down, the component described on "top" will become the component described on "bottom". In the drawings, the shapes shown may be deformed according to manufacturing technique and/or tolerances. Thus, exemplary embodiments of the present disclosure are not limited to the shapes as shown in the drawings and may include shape changes caused during the manufacturing process. Further, different components and regions in the drawings are shown only schematically, and therefore the present disclosure is not limited to the dimensions or distances shown in the drawings.

Figure 1B:
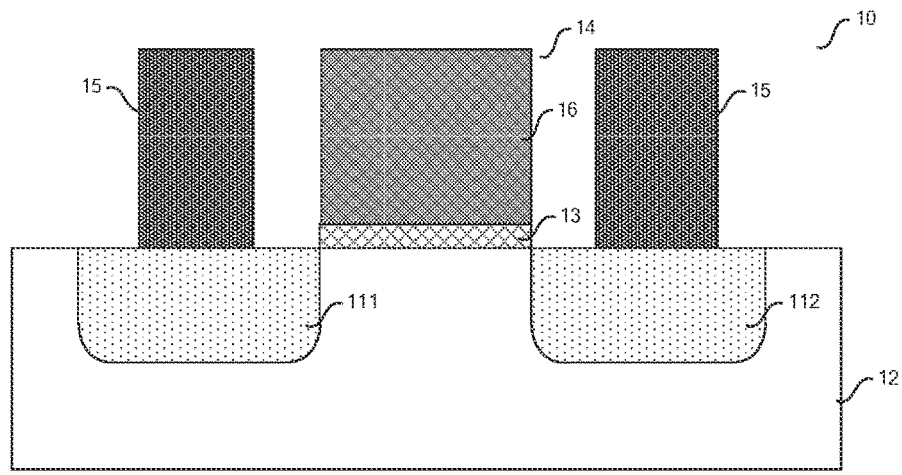

FIG. 1a and FIG. 1B show a typical semiconductor transistor structure (for example only), wherein FIG. 1a is a schematic top view, and FIG. 1B is a schematic cross-sectional view along the channel length direction aa' as shown in FIG. 1a.

In some embodiments, when a certain voltage is applied to a gate structure, an inversion layer is formed on a substrate surface between a source region and a drain region. That is, a channel of the semiconductor transistor is generated, wherein the channel length direction is a direction from the source region to the drain region or from the drain region to the source region (the direction indicated by aa' in FIG. 1a). It is to be understood that the transistor structure shown above is only one possible implementation, and the solutions provided by the present disclosure may also be applied to various transistor structures.

As shown in FIG. 1B, the semiconductor transistor structure 10 includes: a substrate 12 a gate structure 14, and a source region 111 and a drain region 112 positioned on two sides of the gate structure 14, which may also be referred to as a source and a drain. The gate structure 14 includes a conductive layer 16, and there is provided a gate oxide layer 13 between the gate structure 14 and the substrate 12. A conductive plug 15 penetrating through a dielectric layer is provided in a region corresponding to the source region 111 and the drain region 112. The conductive plug 15 is configured to transduce an external electrical signal to the source region 111 and the drain region 112 of the transistor.

In practical applications, a variety of capacitances may exist in the above structures, especially the capacitances between the gate and the source region and the capacitances between the gate and the drain region may have a negative effect on high-frequency characteristics of the transistor. Therefore, there is an urgent need for a solution that can reduce the capacitances between the gate and the source/drain region of semiconductor transistor.

In view of the above problems, it is found in the present disclosure that the capacitances between the gate and the source/drain region of the semiconductor transistor are positively correlated with a parasitic capacitance generated between the gate conductive layer and the conductive plug. Based on this finding, the present disclosure provides a solution to reduce the parasitic capacitance between the gate conductive layer and the conductive plug of the semiconductor transistor, thereby reducing the capacitances between the gate and the source/drain region.

Technical solutions of the present disclosure and how to solve the above technical problems based on the technical solutions of the present disclosure are described in detail below with reference to some embodiments. The following embodiments may be combined with each other, and the same or similar concepts or processes may not be repeated in some embodiments. The embodiments of the present disclosure will be described below with reference to the accompanying drawings.

Embodiment I

Figure 2A:
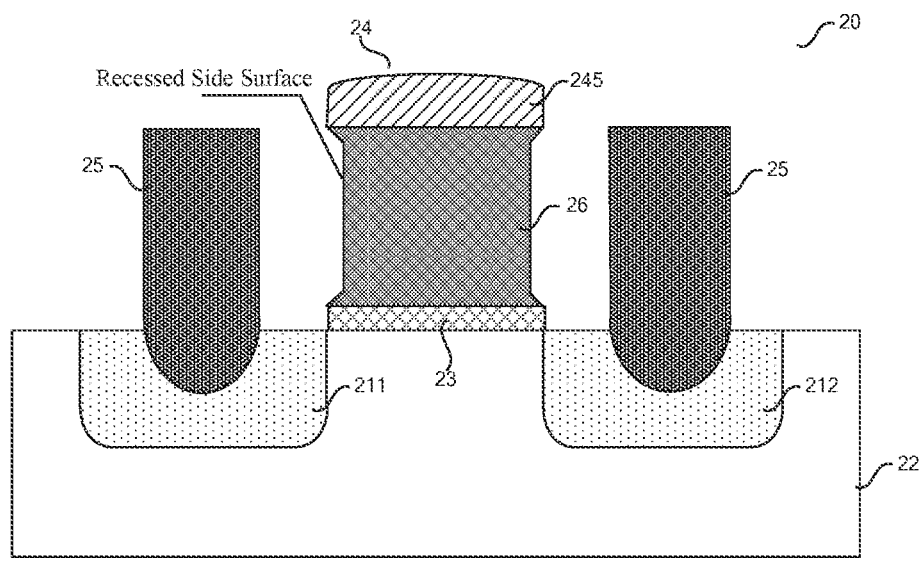
FIG. 2a is a schematic cross-sectional view of a semiconductor structure according to Embodiment I of the present disclosure.

FIG. 2a is a schematic cross-sectional view of a semiconductor structure according to Embodiment I of the present disclosure. This semiconductor structure is configured to reduce a parasitic capacitance between a gate and a conductive plug of a semiconductor transistor. As shown in FIG. 2a, the semiconductor structure 20 includes:

a source region 211 and a drain region 212 arranged at intervals on a substrate 22;

a gate oxide layer 23 arranged between the source region 211 and the drain region 212;

a gate structure 24 arranged on the gate oxide layer 23; and a conductive plug 25 arranged at a corresponding location of the source region 211 and a corresponding location of the drain region 212.

The gate structure 24 comprises a conductive layer 26 having a recessed side surface facing toward the conductive plug 25.

The substrate 22 may be a semiconductor substrate, such as monocrystalline silicon or polysilicon, or amorphous structure such as silicon or silicon germanium (SiGe), or may be a hybrid semiconductor structure, such as silicon carbide, indium antimonide, lead telluride, indium arsenide, indium phosphide, gallium arsenide or gallium antimonide, an alloy semiconductor, or a combination thereof. However, in this embodiment, types of the substrate 22 are not limited thereto. The gate structure may include at least one conductive layer. The "conductive layer having a recessed side surface" mentioned in this embodiment refers to one or more conductive layers included in the gate structure.

As shown in FIG. 2a, the substrate 22 has the source region 211 and the drain region 212 arranged at intervals (the figure is for example only, and actual locations of the source region and the drain region may be interchangeable). The "source/drain region" and "source and drain regions" in the present disclosure refer to the source region and the drain region. It is to be understood that the figure is only an example. For example, the gate oxide layer 23 may cover a region other than a surface of the substrate between the source region 211 and the drain region 212. In practical applications, the gate oxide layer may be prepared together with a dielectric layer on the surface of the substrate. The gate oxide layer 23 is provided with the gate structure 24, and is positioned between the source region 211 and the drain region 212 to control the transistor to be enabled or disabled according to an externally applied voltage. The conductive plug 25 arranged at the corresponding location of the source region 211 and the corresponding location of the drain region 212 is in contact with the source region 211 and the drain region 212 to transduce an electrical signal to the source region and the drain region to implement functions of the transistor. In some embodiments, the gate structure 24 may also include a protection layer 245. The protection layer can protect the gate structure from damage. The protection layer may include, but is not limited to, a silicon nitride layer.

In the present disclosure, it is found that in the above structure a parasitic capacitance is formed between the conductive layer of the gate structure and the conductive plug, wherein the parasitic capacitance constitutes a part of the capacitances between the gate and the source/drain region. Particularly in the semiconductor field with higher integration and smaller product size, these capacitances may have a negative effect on the device characteristics of the semiconductor transistor. In this regard, the present disclosure provides a semiconductor structure. As shown in FIG. 2a, the gate structure includes a conductive layer having a recessed side surface facing toward the conductive plug. The semiconductor structure provided by the present disclosure can reduce the parasitic capacitance between the conductive layer of the gate structure and the conductive plug, such that the capacitances between the gate and the source and drain regions are reduced, and thus the device characteristics are improved.

Figure 2B:
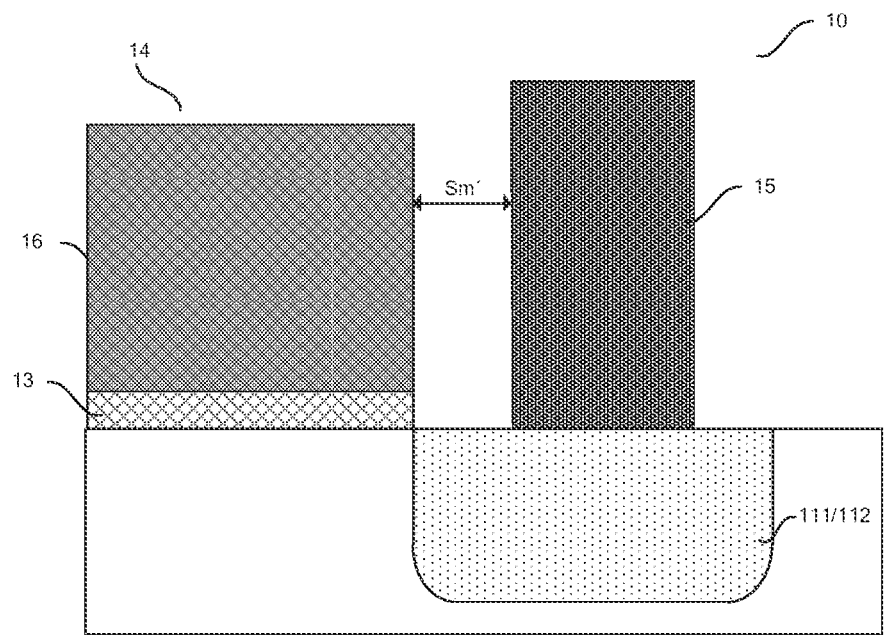
FIG. 2b is an enlarged partial view of an existing semiconductor structure.
Figure 2C:
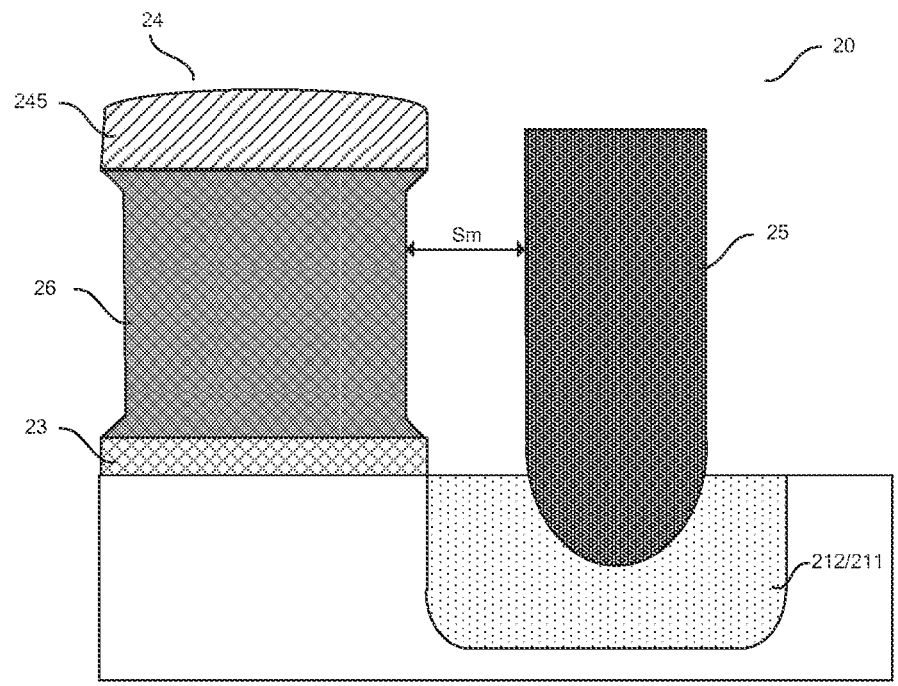
FIG. 2c is an enlarged partial view of a semiconductor structure according to an embodiment of the present disclosure.

To more intuitively understand the present disclosure, a description is made with reference to FIG. 2b and FIG. 2c. As shown in the figures, FIG. 2b is an enlarged partial view of an existing semiconductor structure, and FIG. 2c is an enlarged partial view of a semiconductor structure according to the present disclosure. In the semiconductor structure as shown in FIG. 2b, the gate structure 14 includes the conductive layer 16, and the conductive plug 15 is arranged at a location corresponding to the source region or the drain region. In the semiconductor structure as shown in FIG. 2c, the gate structure 24 includes the conductive layer 26, and the conductive plug 25 is arranged at a location corresponding to the source region or the drain region. As can be seen in the semiconductor structure as shown in FIG. 2c, the conductive layer 26 has an inwardly recessed side surface, which is a side surface of the conductive layer 26 facing toward the conductive plug 25. Thus, the "recessed" herein refers to a direction far away from the conductive plug 25.

As can be seen by comparing FIG. 2b with FIG. 2c, in the existing semiconductor structure, a distance between the conductive layer and the conductive plug is denoted by Sm', and in the semiconductor structure provided by the present disclosure, a distance between the conductive layer and the conductive plug is denoted by Sm, wherein Sm is greater than Sm'. Therefore, compared with the gate structure without the recessed side surface, in the semiconductor structure provided by the present disclosure, at least one conductive layer of the gate structure has a recessed side surface facing toward the conductive plug, and thus a distance from a side surface of the at least one conductive layer to the conductive plug is increased, such that the parasitic capacitance between the conductive layer and the conductive plug is reduced.

It is to be noted that only one conductive plug is illustrated in the enlarged view. However, it is to be understood that in other semiconductor structures, even if a structural location of the conductive plug is different from that as shown in the figure, the solutions of the present disclosure can still be applied to the gate structures of these semiconductor structures, such that the gate structures comprise at least one target conductive layer, wherein a side surface of the conductive layer facing toward the conductive plug is the recessed side surface. Therefore, these solutions also fall within the solutions provided by the embodiments of the present disclosure. In one embodiment, the semiconductor structure may further include a lightly doped region respectively arranged on two sides of the gate structure. A short channel effect can be reduced by providing the lightly doped region on two sides of the gate.

In the semiconductor structure provided by this embodiment, the gate structure includes at least one conductive layer having a recessed side surface facing toward the conductive plug. Compared with a traditional gate structure, the distance between the at least one conductive layer of the gate structure and the conductive plug in the present disclosure is increased, thereby reducing the parasitic capacitance between the gate structure and the conductive plug, such that the capacitances between the gate and the source/drain region are reduced, and thus the device characteristics are improved.

Each part (the conductive plug and a side isolation structure) of the semiconductor structure will be illustrated below with reference to FIG. 3a and FIG. 3b respectively. It is to be appreciated that the following embodiments in FIG. 3a and FIG. 3b may be implemented in conjunction with each other, or may also be implemented in conjunction with any other embodiment of the present disclosure, for example, applied to any semiconductor structure such as the semiconductor structure 20, the semiconductor structures 40, and the semiconductor structure 50.

Figure 3A:
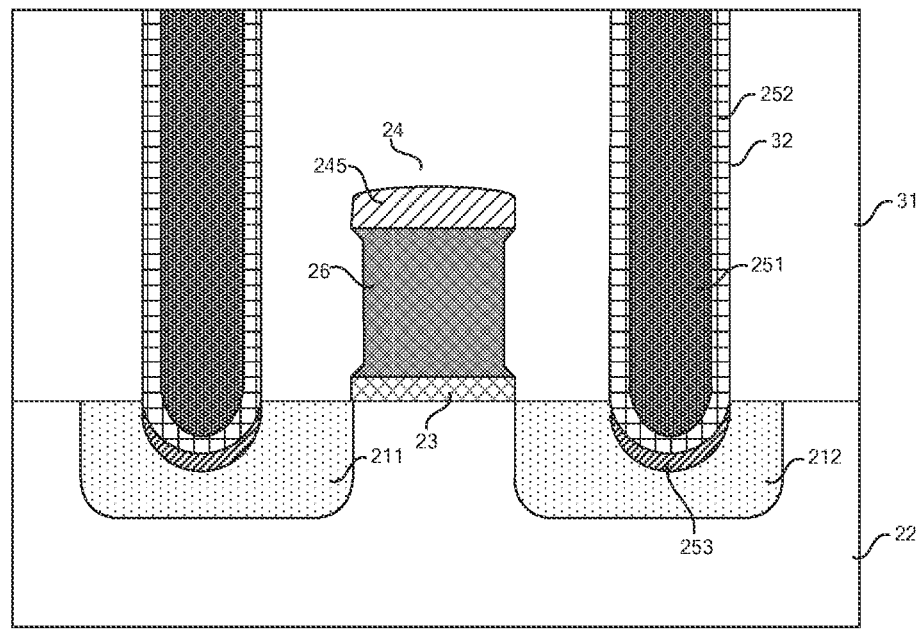
FIG. 3a is a schematic cross-sectional view of another semiconductor structure according to Embodiment I of the present disclosure.

FIG. 3a is a schematic cross-sectional view of another semiconductor structure according to Embodiment I of the present disclosure. In this embodiment, the structure of the conductive plug is illustrated. As shown in FIG. 3a, on the basis of any other embodiment (illustrated in conjunction with the structure as shown in FIG. 2A), the semiconductor structure further includes:

a second dielectric layer 31 arranged on the substrate 22 and the gate structure 24; and a contact hole 32 penetrating though the second dielectric layer 31 and contacting with the corresponding source region 211 and the drain region 212, wherein a bottom of the contact hole 32 is a shallow trench structure, and the shallow trench structure is positioned in the corresponding source region 211 and the drain region 212.

The conductive plug 25 comprises a metal plug 251 filled in the contact hole 32 and a barrier layer 252 positioned between the metal plug 251 and an inner wall of the contact hole 32.

In some embodiments, the conductive plug in this embodiment penetrates through the dielectric layer and is arranged at the location corresponding to the source region and the drain region. An inner and outer multi-layer structure is adopted for the conductive plug. That is, the conductive plug comprises a metal plug positioned in the contact hole and a barrier layer attached between a surface of the metal plug and the inner wall of the contact hole. The barrier layer is configured to prevent the metal plug inside from spreading to the substrate and thus resulting in pollution of the substrate, to ensure the characteristics of the transistor. It is to be noted that the figure is only an example, this embodiment is focused on description of the structure of the conductive plug, and the conductive plug provided in this embodiment may be applied to any other embodiment with reference.

In some embodiments, a metal silicide 253 is filled between the conductive plug 25 and the inner wall of the shallow trench structure. The metal silicide 253 includes, but is not limited to, cobalt silicide (CoSi). By forming the metal silicide on the inner wall of the shallow trench structure, a contact resistance between the conductive plug and the source/drain region can be reduced, and the characteristics of the transistor can be optimized.

In one embodiment, the semiconductor structure may further include a lightly doped region respectively arranged on two sides of the gate structure. A short channel effect can be reduced by providing the lightly doped region on two sides of the gate.

An inner and outer multi-layer structure is adopted for the conductive plug provided by this embodiment, which can prevent metal diffusion and thus ensuring the device characteristics of the transistor.

Figure 3B:
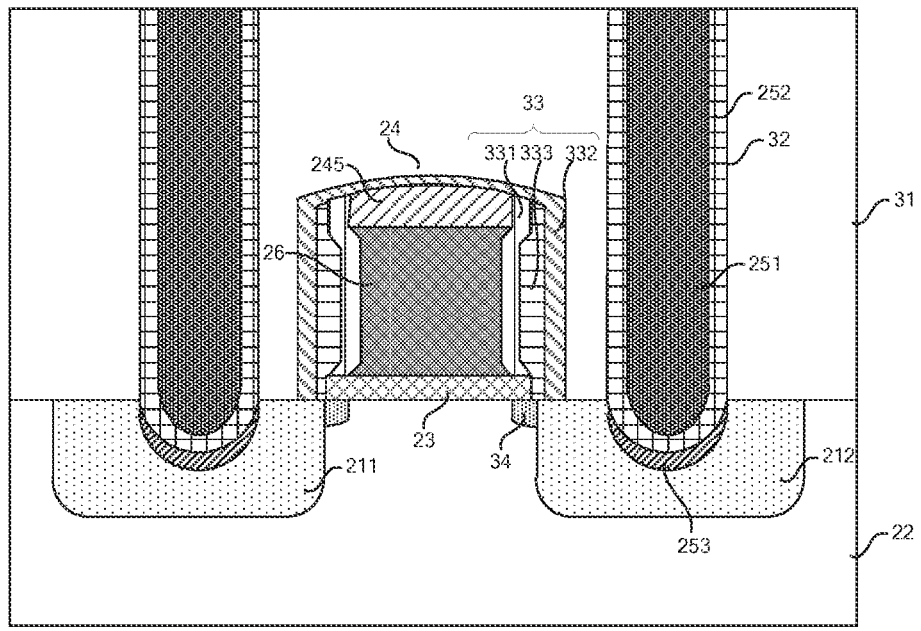
FIG. 3b is a schematic cross-sectional view of another semiconductor structure according to Embodiment I of the present disclosure.

FIG. 3b is a schematic cross-sectional view of another semiconductor structure according to Embodiment I of the present disclosure. In this embodiment, a side isolation structure is illustrated. As shown in FIG. 3b, on the basis of any other embodiment (illustrated in conjunction with the semiconductor structure 20 as shown in FIG. 3b), the semiconductor structure further includes:

a side isolation structure 33 affixed to two sides of the gate structure 24 facing toward the source region 211 and the drain region 212.

In some embodiments, a multi-layer structure may be adopted for the side isolation structure. In one embodiment, the side isolation structure 33 includes a first isolation sidewall 331 and a second isolation sidewall 332. The first isolation sidewall 331 is affixed to the side surface of the gate structure 24, the second isolation sidewall 332 is positioned at a periphery of the first isolation sidewall 331, and a top of the second isolation sidewall 332 extends to a top of the first isolation sidewall 331 to form an enclosed space filled with a spacer medium 333. The spacer medium 333 includes, but is not limited to, silicon oxide, air, and the like. A material of the first isolation sidewall and a material of the second isolation sidewall may comprise silicon nitride.

Each part of the side isolation structure may be positioned on the gate oxide layer or the substrate. As another example, the first isolation sidewall is positioned on the gate oxide layer, and the spacer medium and the second isolation sidewall are positioned on the substrate (as shown in the example in FIG. 3b). As another example, the first isolation sidewall and the spacer medium are positioned on the gate oxide layer, and the second isolation sidewall is positioned on the substrate. As yet another example, the first isolation sidewall, the spacer medium, and the second isolation sidewall are all positioned on the gate oxide layer.

A multi-layer structure may be adopted for the side isolation structure, which may give consideration to a support effect and a stress. In some embodiments, the first isolation sidewall and the second isolation sidewall may be made from materials such as silicon nitride with higher hardness, higher compactness and higher dielectric constant, to exert a good support effect and exert an effective isolation and insulation effect. Furthermore, in consideration of good stress, a material such as silicon oxide having good stress characteristic is filled between the first isolation sidewall and the second isolation sidewall of the side isolation structure provided by this embodiment. In one embodiment, air is filled between the first isolation sidewall and the second isolation sidewall to exert better isolation and insulation effects, and to reduce stress effects. Filling air between the first isolation sidewall and the second isolation sidewall can also reduce an equivalent dielectric constant between the gate structure 24 and the conductive plug 25, such that the parasitic capacitance therebetween is further reduced.

In one embodiment, the semiconductor structure may further include a lightly doped region 34 respectively arranged on two sides of the gate structure. A short channel effect can be reduced by providing the lightly doped region on two sides of the gate. In some embodiments, a region of the lightly doped region 34 may be determined according to device design. For example, the lightly doped region 34 is positioned below the first isolation sidewall (as the example in FIG. 3b), or below the first isolation sidewall and the spacer medium, or below the first isolation sidewall, the spacer medium, and the second isolation sidewall.

In this embodiment, the side isolation structure is respectively arranged on two sides of the gate structure to prevent occurrence of short circuit between the gate and other components, thereby ensuring good characteristics of the transistor.

Different embodiments of the gate structure are described below with reference to Embodiment II. Likewise, Embodiment II may be implemented in various combinations with any other embodiment of the present disclosure, for example, implemented in combination with embodiments corresponding to the recessed side surface, the conductive plug, and the side isolation structure.

Embodiment II

Figure 4:
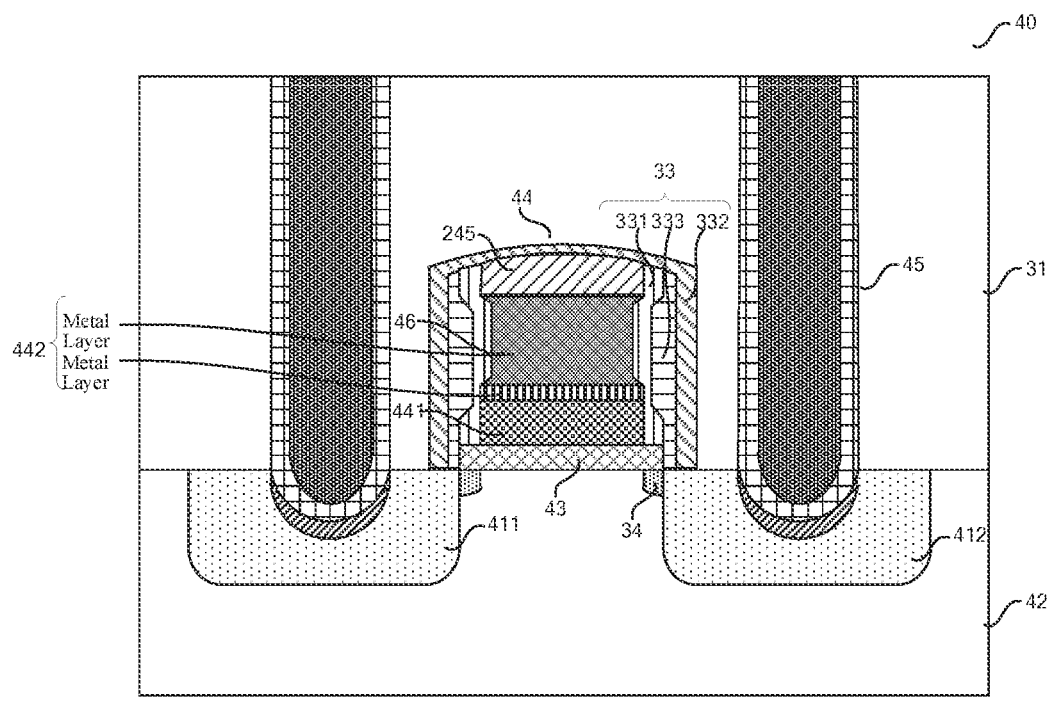
FIG. 4 is a schematic cross-sectional view of a semiconductor structure according to Embodiment II of the present disclosure.

FIG. 4 is a schematic cross-sectional view of a semiconductor structure according to Embodiment II of the present disclosure. The gate structure in this embodiment includes a conductive layer and a plurality of metal layers. As shown in FIG. 4, the semiconductor structure 40 includes:
- a source region 411 and a drain region 412 arranged at intervals on a substrate 42;
- a gate oxide layer 43 arranged between the source region 411 and the drain region 412;
- a gate structure 44 arranged on the gate oxide layer 43; and
- a conductive plug 45 arranged at a corresponding location of the source region 411 and a corresponding location of the drain region 412.

The gate structure 44 includes a first conductive layer 441 and a second conductive layer 442. The first conductive layer 441 is arranged on the gate oxide layer 43, and the second conductive layer 442 is arranged on the first conductive layer 441. The second conductive layer 442 includes a plurality of metal layers (it is taken as an example where two metal layers are included in the figure) stacked, and at least one of the metal layers 46 has a recessed side surface facing toward the conductive plug 45. The metal layer here may comprise a metal such as tungsten, or may comprise a metal compound such as titanium nitride. It is to be noted that the reference numerals in FIG. 4 other than those corresponding to the above reference numerals refer to the structures shown in the related drawings in other embodiments, which are shown in conjunction with FIG. 4 as an embodiment of the present disclosure.

The substrate 42 may be a semiconductor substrate, such as monocrystalline silicon or polysilicon, or amorphous structure such as silicon or silicon germanium (SiGe), or may be a hybrid semiconductor structure, such as silicon carbide, indium antimonide, lead telluride, indium arsenide, indium phosphide, gallium arsenide or gallium antimonide, an alloy semiconductor, or a combination thereof. However, in this embodiment, types of the substrate 42 are not limited thereto. The gate structure includes a first conductive layer arranged on the gate oxide layer and a second conductive layer arranged on the first conductive layer. The second conductive layer includes a plurality of metal layers, and the "conductive layer having a recessed side surface" in this embodiment is one or more of the plurality of metal layers.

In practical applications, a threshold voltage of the transistor is mainly determined by a difference between a work function of the gate and a work function of the gate oxide layer. Therefore, in this embodiment, no recessed side surface is provided for the first conductive layer directly in contact with the gate oxide layer, to ensure work function match and to reduce a contact resistance. In addition, to optimize the characteristics of the transistor, in one embodiment, the first conductive layer 441 includes a polysilicon layer. In some embodiments, polysilicon can change its work function by doping impurities with different polarities, to adjust the threshold voltage of the transistor. In another embodiment, the second conductive layer 442 includes a plurality of metal layers, which include, but are not limited to, a titanium nitride layer and a tungsten layer. In one example, the second conductive layer includes a titanium nitride layer arranged on the polysilicon layer, and a tungsten layer arranged on the titanium nitride layer, wherein the tungsten layer has an inclined side surface facing toward the conductive plug. It is to be noted that the above embodiments can also be implemented in combination with each other.

Similarly, compared with the gate structure without the recessed side surface, at least one metal layer in the second conductive layer provided by this embodiment has such a recessed side surface, and thus the distance from the at least one metal layer to the conductive plug is increased, such that the parasitic capacitance between the metal layer and the conductive plug is reduced. In this way, the parasitic capacitance between the whole gate structure and the source region or the drain region connected to the conductive plug is reduced.

In the semiconductor structure provided by this embodiment, the second conductive layer of the gate structure includes a plurality of metal layers, and at least one metal layer having a recessed side surface facing toward the conductive plug is present in the plurality of metal layers. Compared with the gate structure without the recessed side surface, the distance from the metal layer having the recessed side surface to the conductive plug in the present disclosure is increased, such that the parasitic capacitance between the gate structure and the conductive plug is reduced. In this way, the capacitances between the gate and the source/drain region are reduced, and thus the device characteristics are improved.

Figure 5:
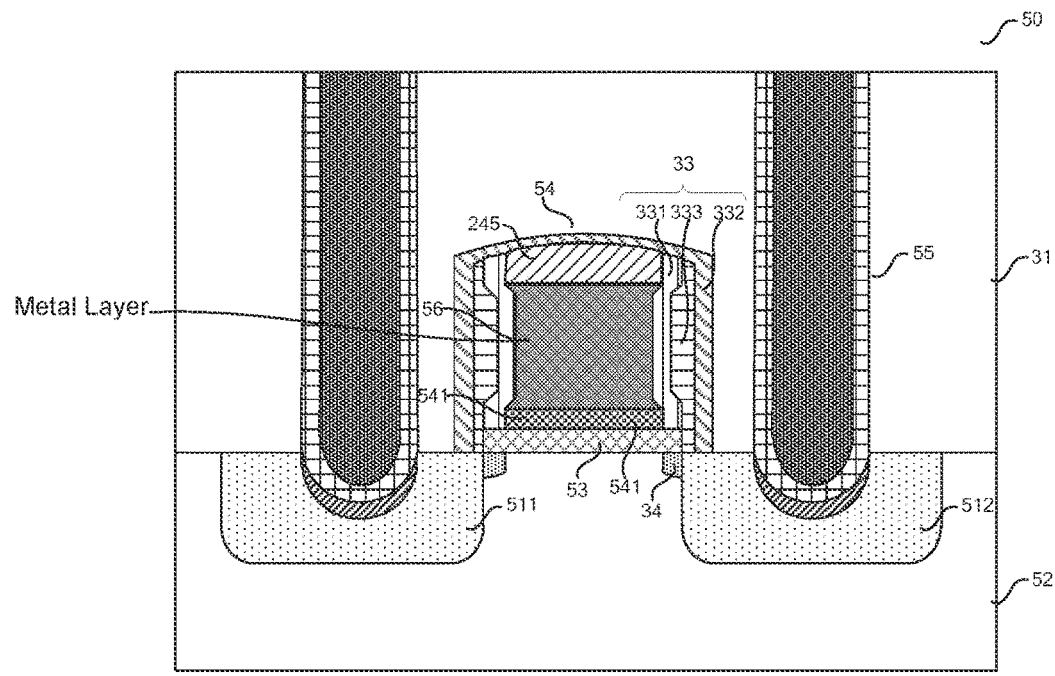
FIG. 5 is a schematic cross-sectional view of another semiconductor structure according to Embodiment II of the present disclosure.

FIG. 5 is a schematic cross-sectional view of another semiconductor structure according to Embodiment II of the present disclosure. The gate structure in this embodiment includes a dielectric layer and a metal layer. As shown in FIG. 5, the semiconductor structure 50 includes:
- a source region 511 and a drain region 512 arranged at intervals on a substrate 52;
- a gate oxide layer 53 arranged between the source region 511 and the drain region 512;
- a gate structure 54 arranged on the gate oxide layer 53; and
- a conductive plug 55 arranged at a corresponding location of the source region 511 and a corresponding location of the drain region 512.

The gate structure 54 includes a first dielectric layer 541 and a third conductive layer. The first dielectric layer 541 is arranged on the gate oxide layer 53, and the third conductive layer is arranged on the first dielectric layer 541. The third conductive layer is a metal layer 56 having a recessed side surface facing toward the conductive plug 55.

The substrate 52 may be a semiconductor substrate, such as monocrystalline silicon or polysilicon, or amorphous structure such as silicon or silicon germanium (SiGe), or may be a hybrid semiconductor structure, such as silicon carbide, indium antimonide, lead telluride, indium arsenide, indium phosphide, gallium arsenide or gallium antimonide, an alloy semiconductor, or a combination thereof. However, in this embodiment, types of the substrate 52 are not limited thereto. The gate structure 54 includes a first dielectric layer arranged on the gate oxide layer, and a third conductive layer arranged on the first dielectric layer. The third conductive layer is a metal layer such as a single metal layer or multiple metal layers. The single metal layer is taken as an example to illustrate the "conductive layer having a recessed side surface" in this embodiment.

In one embodiment, the first dielectric layer 541 includes a high dielectric constant material such as hafnium oxide, zirconium oxide, and the like. The first dielectric layer and the gate oxide layer together constitute a gate dielectric layer to reduce tunneling effects. In another embodiment, the third conductive layer arranged on the first dielectric layer 541 includes a tungsten layer having a recessed side surface facing toward the conductive plug. The third conductive layer may also be a metal such as copper, aluminum, and titanium, etc. It is to be noted that the two embodiments may be implemented in combination with each other.

Similarly, compared with the gate structure without the recessed side surface, at least one metal layer in the third conductive layer provided by this embodiment has such a recessed side surface, and thus the distance from the at least one metal layer to the conductive plug is increased, such that the parasitic capacitance between the metal layer and the conductive plug is reduced. In this way, the parasitic capacitance between the whole gate structure and the source region or the drain region connected to the conductive plug is reduced.

In the semiconductor structure provided by this embodiment, the gate structure includes a first dielectric layer and a third conductive layer, wherein the third conductive layer includes a metal layer having a recessed side surface facing toward the conductive plug. Compared with the gate structure without the recessed side surface, the distance from the metal layer having the recessed side surface to the conductive plug in the present disclosure is increased, such that the parasitic capacitance between the gate structure and the conductive plug is reduced. In this way, the capacitances between the gate and the source/drain region are reduced, and thus the device characteristics are improved.

Different embodiments of the recessed side surface are described below with reference to Embodiment III. It is to be noted that the following embodiment of the recessed side surface may be applied to the conductive layer of the gate structure of any other embodiment.

Embodiment III

Figure 6A:
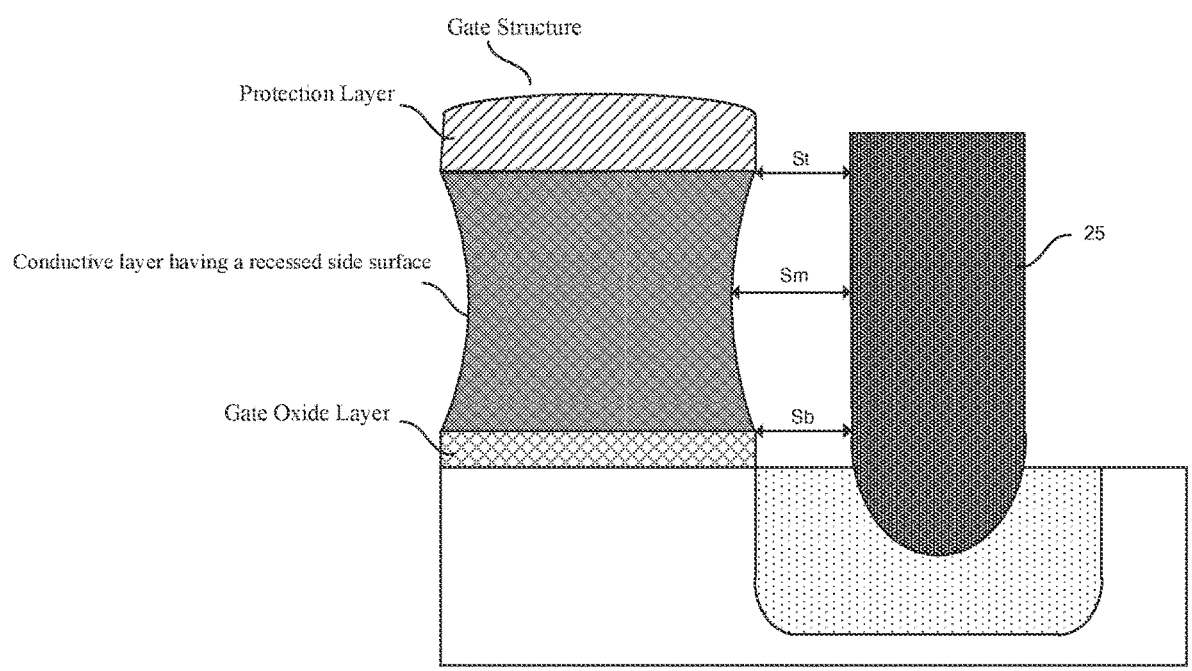
FIG. 6a and FIG. 6b are schematic structural diagrams of a recessed side surface according to Embodiment III of the present disclosure.
Figure 6B:
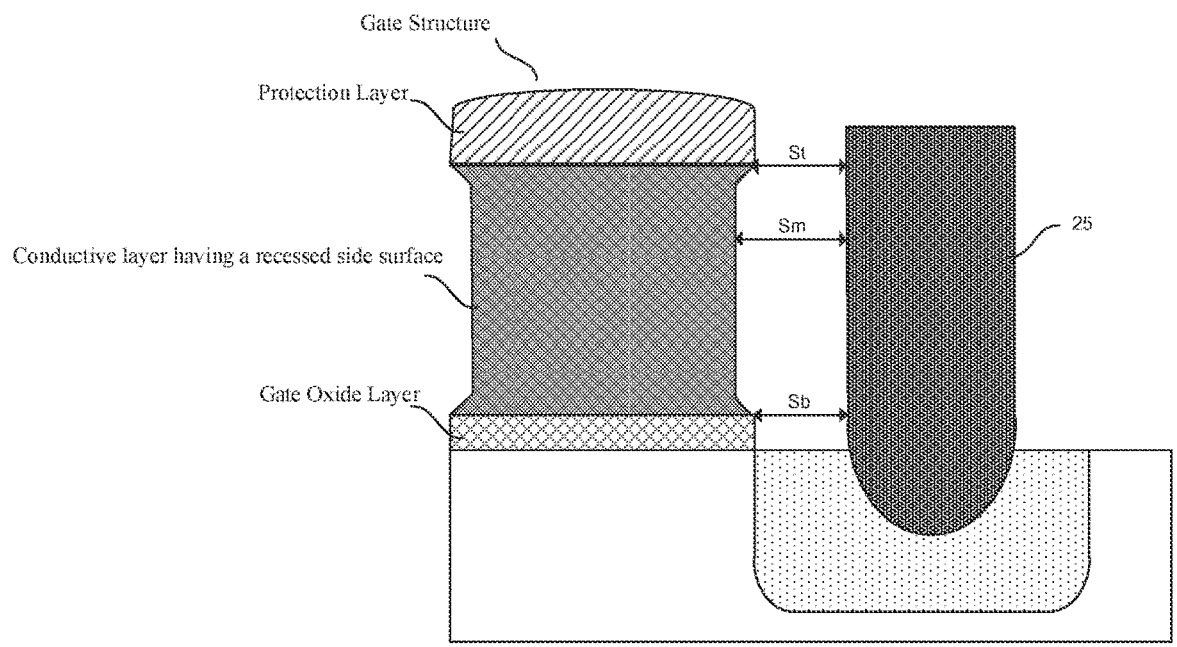

FIG. 6a and FIG. 6b are schematic structural diagrams of a recessed side surface according to Embodiment III of the present disclosure, and the recessed side surface is illustrated in conjunction with a part of the structure in FIG. 4. As shown in FIG. 6a and FIG. 6b, on the basis of any other embodiment:
    a first distance St from an upper edge of the recessed side surface to the conductive plug is greater than a third distance Sm between a middle location of the recessed side surface and the conductive plug, and a second distance Sb from a lower edge of the recessed side surface to the conductive plug is greater than the third distance Sm, wherein the middle location is positioned between the upper edge and the lower edge of the recessed side surface.

In one embodiment, the first distance is approximately equal to the second distance, to facilitate process preparation. It is to be noted that the figures also show other structures positioned near the recessed side surface, such as the substrate, the gate oxide layer and the gate structure, which are all examples and do not limit the scope of this embodiment. In some embodiments, this embodiment focuses on description of the structure of the recessed side surface, and the recessed side surface provided by this embodiment may be implemented in conjunction with any other embodiment.

As an example, between the upper edge and the lower edge of the recessed side surface, the closer a location to the center, the greater the distance from the location to the conductive plug. Assuming that it is observed from a cross-section of the semiconductor structure along a direction of a channel length, in the structure of the recessed side surface, distances from each location between the upper edge and the lower edge to the conductive plug are different. For example, the cross-section of the recessed side surface along the direction of the channel length is roughly C-shaped, as shown in FIG. 6a.

As another example, distances from any location within a central region between the upper edge and the lower edge of the recessed side surface to the conductive plug are equal, and the closer a location to a center of a region other than the central region, the greater a distance from this location to the conductive plug. The central region here refers to a region extending from the central location to a surrounding region. Assuming that it is observed from the cross-section of the semiconductor structure along the direction of the channel length, in the structure of the recessed side surface, a part of region is present between the upper edge and the lower edge, wherein distances from any location within this part of region to the conductive plug are equal, and beyond this part of region, the closer a location to a center, the greater a distance from this location to the conductive plug. For example, the cross-section of the recessed side surface along the direction of the channel length is roughly shaped like a square, as shown in FIG. 6b.

The recessed side surface provided by this embodiment may be applied to the foregoing structures, such that at least one conductive layer in the gate structure has the recessed side surface facing toward the conductive plug. Compared with the gate structure without the recessed side surface, the distance between the conductive layer having the recessed side surface and the conductive plug is increased, such that the parasitic capacitance between the gate structure and the conductive plug is reduced. In this way, the capacitances between the gate and the source/drain region are reduced, and thus the device characteristics are improved.

Embodiment IV

Figure 7:
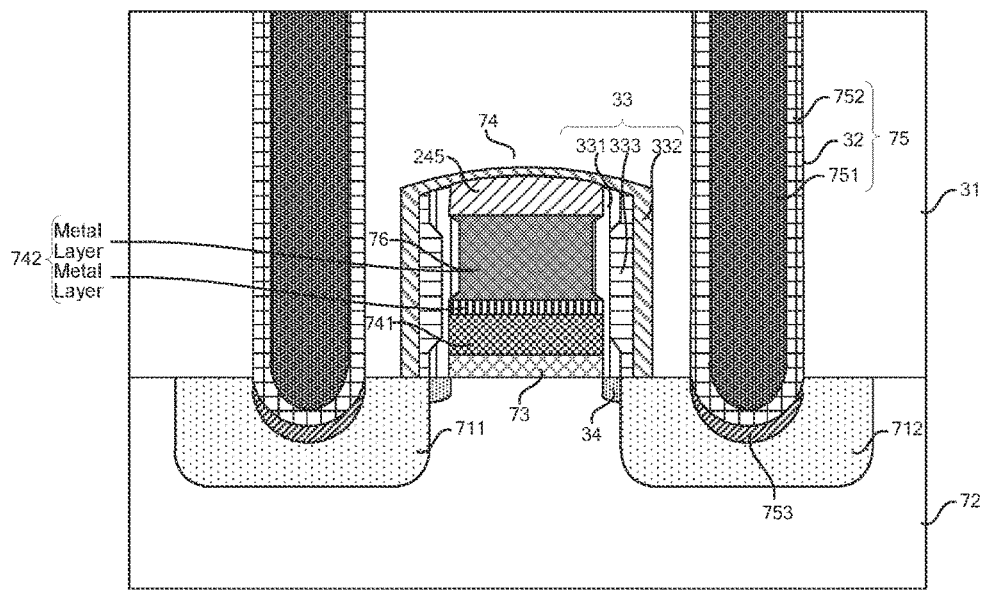
FIG. 7 is a schematic structural diagram of a semiconductor structure according to Embodiment IV of the present disclosure.

This embodiment provides an example for combining several embodiments among the above embodiments. FIG. 7 is a schematic structural diagram of a semiconductor structure according to Embodiment IV of the present disclosure, and the semiconductor structure is based on combination of the embodiments as shown in FIG. 3a and FIG. 3b, Embodiment II and Embodiment III. As shown in FIG. 7, the semiconductor structure includes:
    a source region 711 and a drain region 712 arranged at intervals on the substrate 72, a gate oxide layer 73 arranged between the source region 711 and the drain region 712, a gate structure 74 arranged on the gate oxide layer 73, and a conductive plug 75 arranged at a corresponding location of the source region 711 and a corresponding location of the drain region 712.

The gate structure 74 includes a first conductive layer 741 and a second conductive layer 742. The first conductive layer 741 is arranged on the gate oxide layer 73, and the second conductive layer 742 is arranged on the first conductive layer 741. The second conductive layer 742 includes a plurality of metal layers stacked, and at least one metal layer 76 has a recessed side surface facing toward the conductive plug 75. The cross-section of the recessed side surface along the direction of the channel length is roughly shaped like a square.

The semiconductor structure also includes: a second dielectric layer 31 arranged on the substrate 72 and the gate structure 74, and a contact hole 32 penetrating though the second dielectric layer 71 and contacting with the corresponding source region 711 and the drain region 712, wherein a bottom of the contact hole 32 is a shallow trench structure, and the shallow trench structure is positioned in the corresponding source region 711 and the drain region 712.

The conductive plug 75 includes a metal plug 751 filled in the contact hole 32, and a barrier layer 752 positioned between the metal plug 751 and an inner wall of the contact hole 32. A metal silicide 753 is filled between the conductive plug 75 and the inner wall of the shallow trench structure.

The gate structure 74 further comprises a side isolation structure 33 affixed to two side surfaces of the gate structure 74 facing toward the source region 211 and the drain region 212. The side isolation structure 33 comprises a first isolation sidewall 331 and a second isolation sidewall 332, wherein the first isolation sidewall 331 is affixed to the side surface of the gate structure 74, and the second isolation sidewall 332 is positioned at a periphery of the first isolation sidewall 331. A top of the second isolation sidewall 332 extends to a top of the first isolation sidewall 331 to form an enclosed space filled with a spacer medium 333, which may be air.

The semiconductor structure also includes a lightly doped region 34 respectively positioned on two sides of the gate structure 74.

Descriptions and effects of the above parts and structures have been described in detail in the foregoing embodiments, so reference may be made to the related contents of the foregoing embodiments, and thus theses descriptions and effects are omitted here.

The foregoing Embodiments I to IV are exemplary descriptions of the semiconductor structure provided in the present disclosure, and a method for fabricating a semiconductor structure will be illustrated below with reference to Embodiments V to VII.

Embodiment V

Figure 8A:
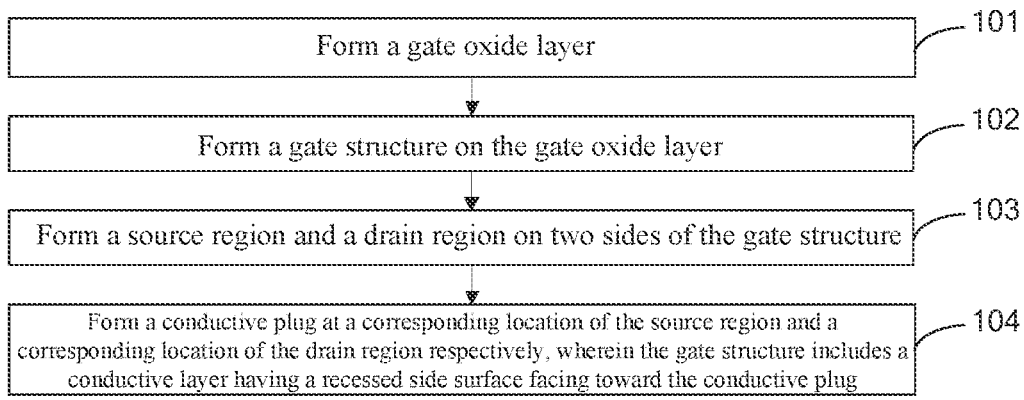
FIGS. 8a-8e are schematic flow diagrams of a method for fabricating a semiconductor structure according to Embodiment V of the present disclosure.

FIG. 8a is a schematic flow diagram of a method for fabricating a semiconductor structure according to Embodiment V of the present disclosure. The semiconductor structure is configured to reduce a parasitic capacitance between a gate and a conductive plug of a semiconductor transistor. As shown in FIG. 8a, the fabrication method comprises:

Step 101: forming a gate oxide layer;
Step 102: forming a gate structure on the gate oxide layer;
Step 103: forming a source region and a drain region on two sides of the gate structure; and
Step 104: forming a conductive plug at a corresponding location of the source region and a corresponding location of the drain region respectively, wherein the gate structure includes a conductive layer having a recessed side surface facing toward the conductive plug.

In some embodiments, Step 102 includes: forming a gate structure on the gate oxide layer, wherein a top layer of the gate structure is a protection layer. That is, the gate structure may also include a top layer serving as the protection layer.

Figure 8B:
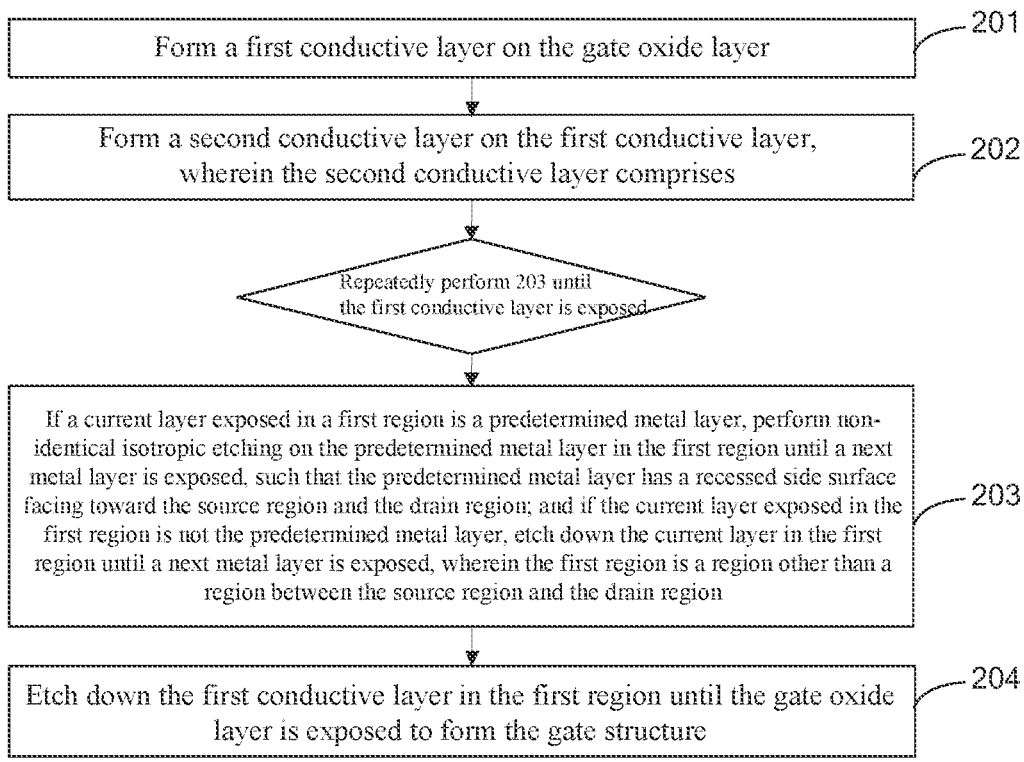

In one example, the gate structure includes a first conductive layer and a second conductive layer, and the second conductive layer includes a plurality of metal layers, wherein at least one of the plurality of metal layers has the recessed side surface. As one embodiment, the gate structure may be obtained by means of the following fabrication method. Correspondingly, as shown in FIG. 8b, Step 102 may include following steps:

Step 201: forming a first conductive layer on the gate oxide layer;
Step 202: forming a second conductive layer on the first conductive layer, wherein the second conductive layer comprises a plurality of metal layers stacked;
repeatedly performing the following Step 203 until the first conductive layer is exposed:
Step 203: if a current layer exposed in a first region is a predetermined metal layer, performing non-identical isotropic etching on the predetermined metal layer in the first region until a next metal layer is exposed, such that the predetermined metal layer has a recessed side surface facing toward the source region and the drain region; and if the current layer exposed in the first region is not the predetermined metal layer, etching down the current layer in the first region until a next metal layer is exposed, wherein the first region is a region other than a region between the source region and the drain region; and
Step 204: etching down the first conductive layer in the first region until the gate oxide layer is exposed to form the gate structure.

Figure 9A:
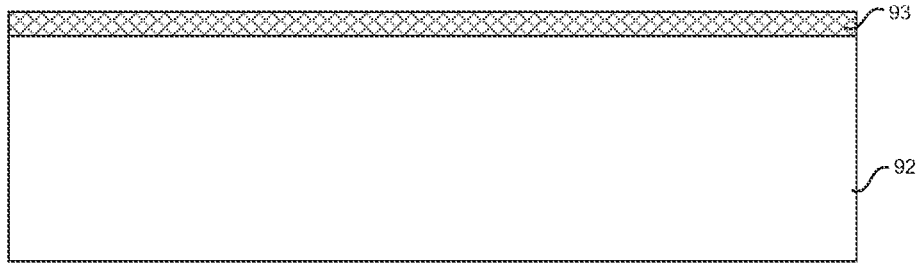
FIGS. 9a-9g relate to schematic structural diagrams of a semiconductor structure during the fabrication method according to Embodiment V as shown in FIG. 8b.
Figure 9B:
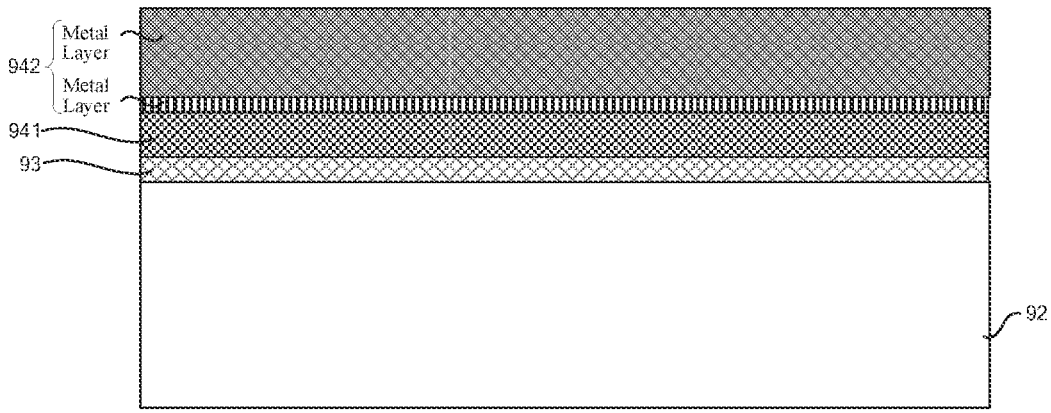
Figure 9C:
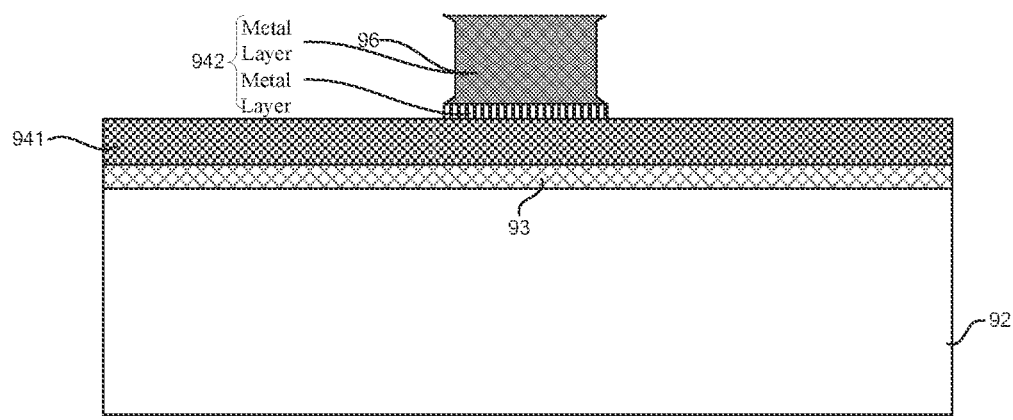
Figure 9D:
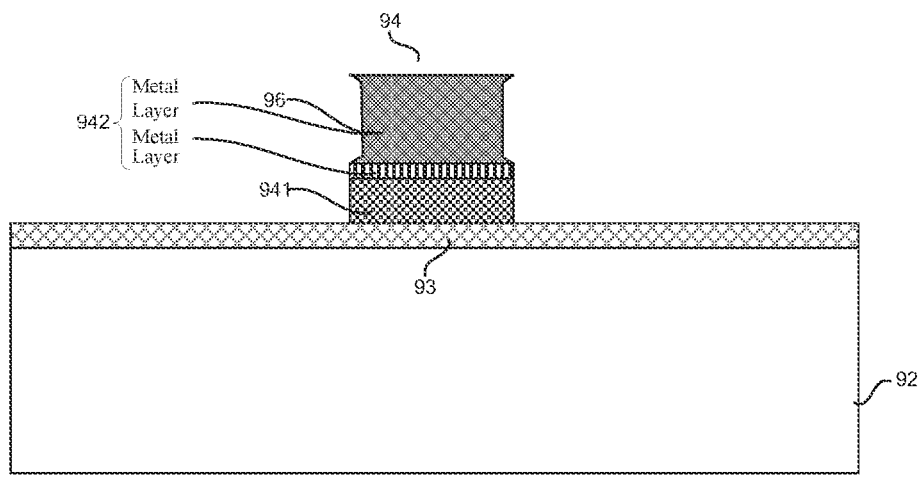
Figure 9E:
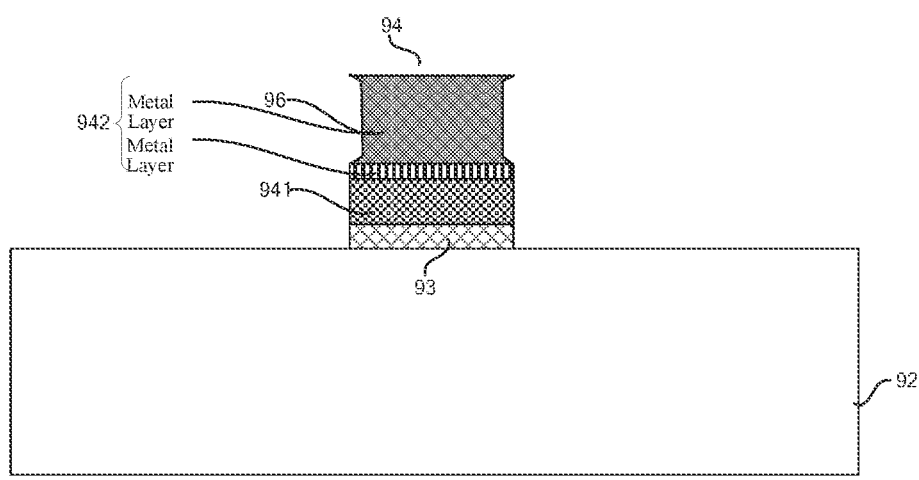
Figure 9F:
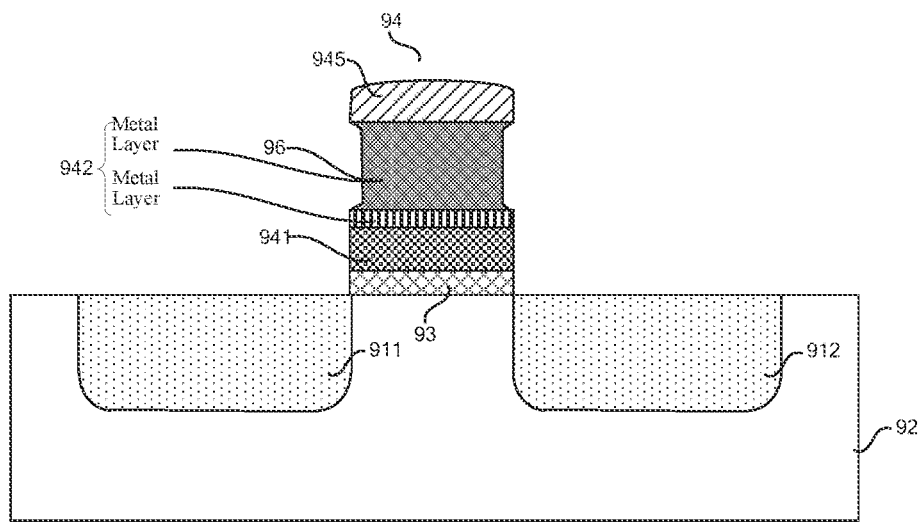
Figure 9G:
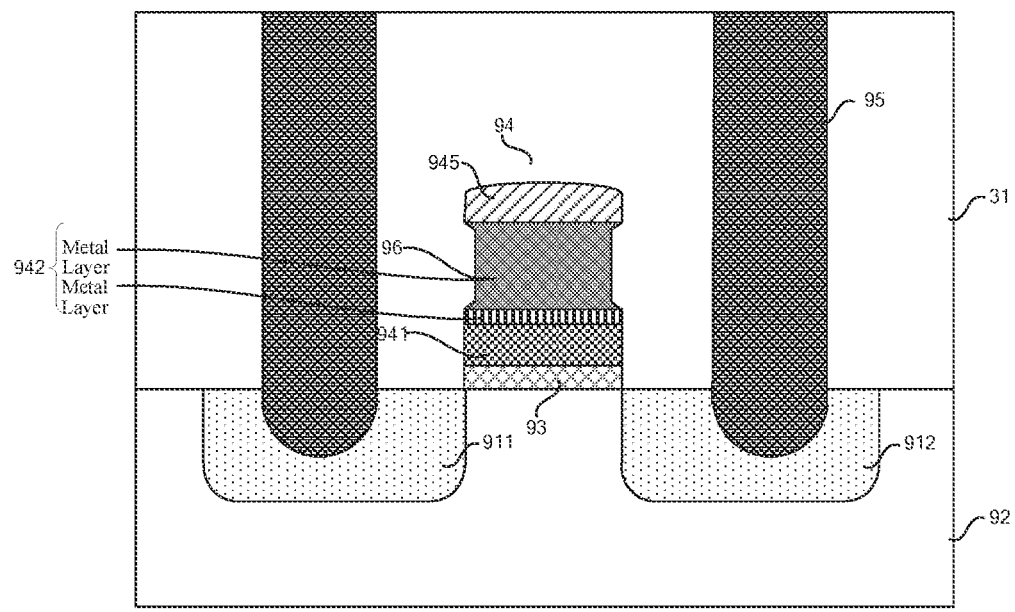

In some embodiments, after Step 101 is performed, a schematic structural diagram of the semiconductor structure is as shown in FIG. 9a, where the substrate is represented by Numeral 92, and the gate oxide layer is represented by Numeral 93. After Step 201 and Step 202 are performed, a schematic structural diagram of the semiconductor structure is as shown in FIG. 9b, where the first conductive layer is represented by Numeral 941, and the second conductive layer is represented by Numeral 942. After Step 203 is performed, a schematic structural diagram of the semiconductor structure is as shown in FIG. 9c, where the predetermined metal layer is represented by Numeral 96. After Step 204 is performed, a schematic structural diagram of the semiconductor structure is as shown in FIG. 9d, where the gate structure is represented by Numeral 94. In some embodiments, Step 103 may include: etching the currently uncovered gate oxide until the substrate is exposed. Accordingly, a schematic structural diagram of the semiconductor structure obtained after this step is performed is as shown in FIG. 9e. After the gate oxide layer is etched, the source region and the drain region positioned on two sides of the gate structure are formed. Accordingly, after this step is performed, a schematic structural diagram of the semiconductor structure is as shown in FIG. 9f, where the source region and the drain region are represented by Numeral 911 and Numeral 912, respectively. The protection layer is represented by Numeral 945 in the figures, and the protection layer may be formed after the gate oxide layer is etched. Accordingly, after Step 104 is performed, a schematic structural diagram of the semiconductor structure is as shown in FIG. 9g, where the conductive plug is represented by Numeral 95, and the second dielectric layer is represented by Numeral 31.

Figure 8C:
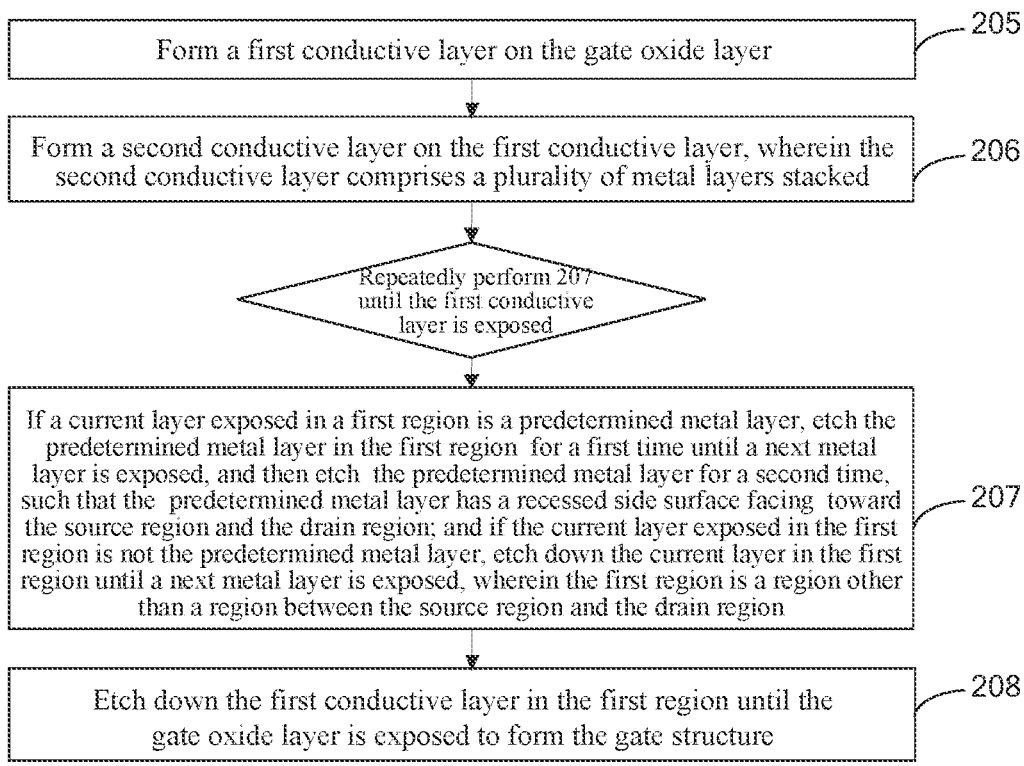

As another embodiment, the gate structure in this example may also be obtained by the following fabrication method. Correspondingly, as shown in FIG. 8c, Step 102 may include:

Step 205: forming a first conductive layer on the gate oxide layer;

Step 206: forming a second conductive layer on the first conductive layer, wherein the second conductive layer comprises a plurality of metal layers stacked;

repeatedly performing the following Step 207 until the first conductive layer is exposed:

Step 207: if a current layer exposed in a first region is a predetermined metal layer, etching the predetermined metal layer in the first region for a first time until a next metal layer is exposed, and then etching the predetermined metal layer for a second time, such that the predetermined metal layer has a recessed side surface facing toward the source region and the drain region; and if the current layer exposed in the first region is not the predetermined metal layer, etching down the current layer in the first region until a next metal layer is exposed, wherein the first region is a region other than a region between the source region and the drain region; and Step 208: etching down the first conductive layer in the first region until the gate oxide layer is exposed to form the gate structure.

In some embodiments, after the above steps are performed, the structure diagram of the semiconductor structure is similar to FIGS. 9a to 9g, and thus is not illustrated here. Compared with the previous embodiment, the main difference lies in that the recessed side surface is formed by means of secondary etching in Step 207.

Figure 8D:
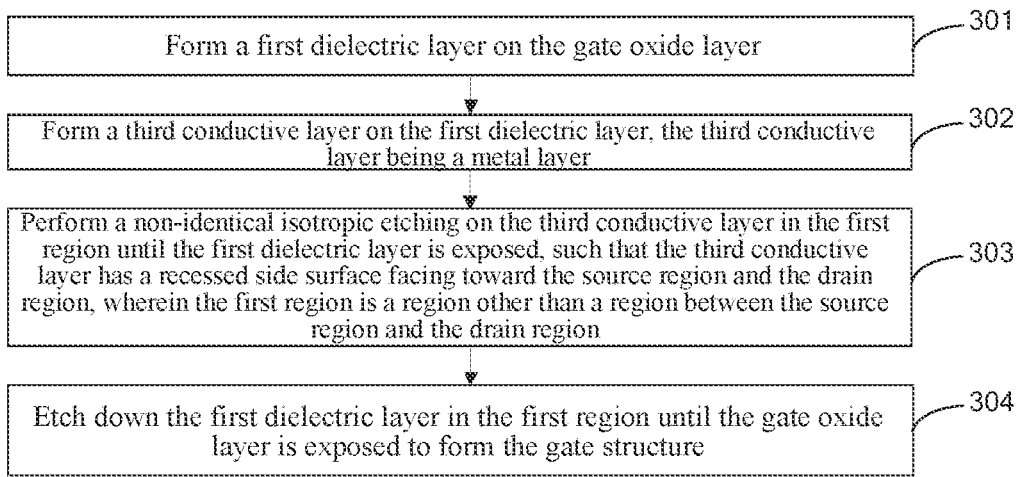

In another example, the gate structure includes a first dielectric layer and a third conductive layer, wherein the third conductive layer includes a metal layer having the recessed side surface. As one embodiment, the gate structure may be obtained by means of the following fabrication method. Correspondingly, as shown in FIG. 8d, Step 102 may include following steps:

Step 301: forming a first dielectric layer on the gate oxide layer;

Step 302: forming a third conductive layer on the first dielectric layer, the third conductive layer being a metal layer;

Step 303: performing a non-identical isotropic etching on the third conductive layer in the first region until the first dielectric layer is exposed, such that the third conductive layer has a recessed side surface facing toward the source region and the drain region, wherein the first region is a region other than a region between the source region and the drain region; and Step 304: etching down the first dielectric layer in the first region until the gate oxide layer is exposed to form the gate structure.

Figure 10A:
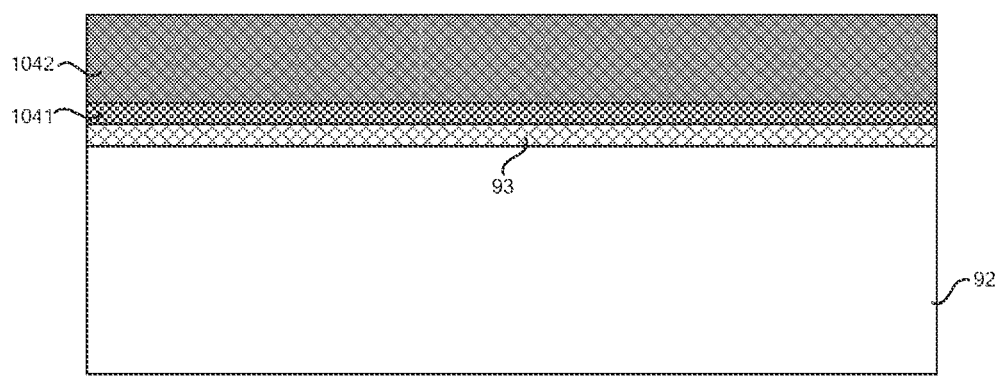
FIGS. 10a-10g relate to schematic structural diagrams of a semiconductor structure during the fabrication method according to Embodiment V as shown in FIG. 8b.
Figure 10B:
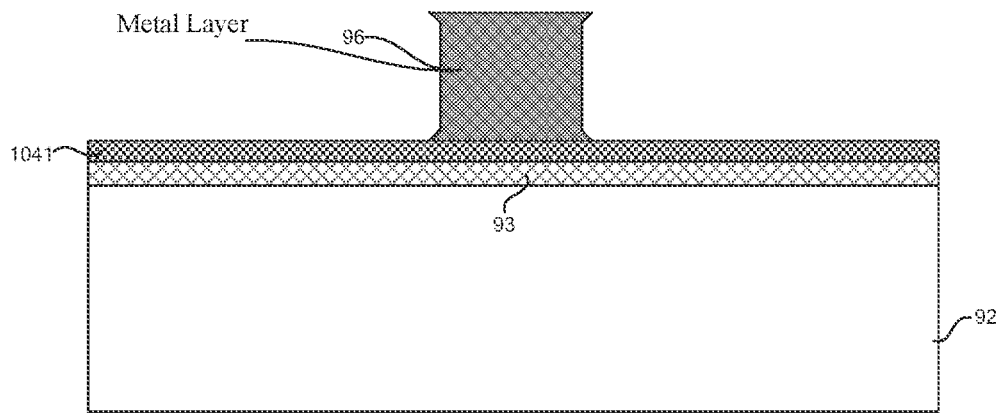
Figure 10C:
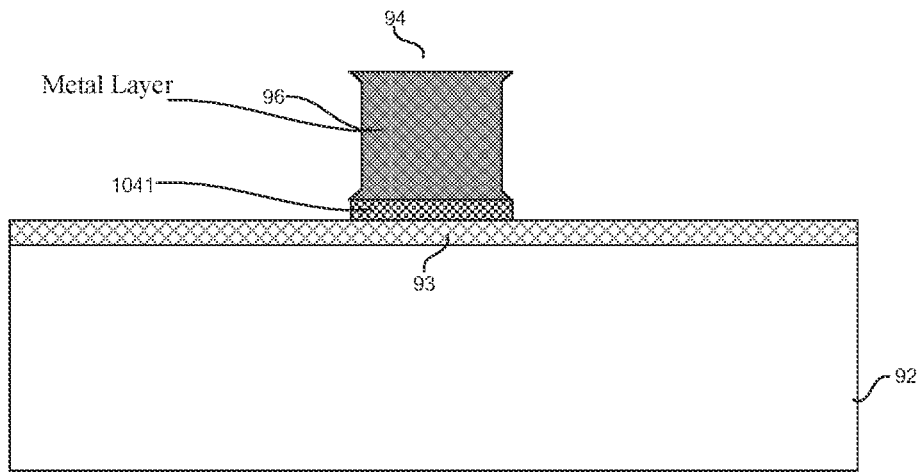
Figure 10D:
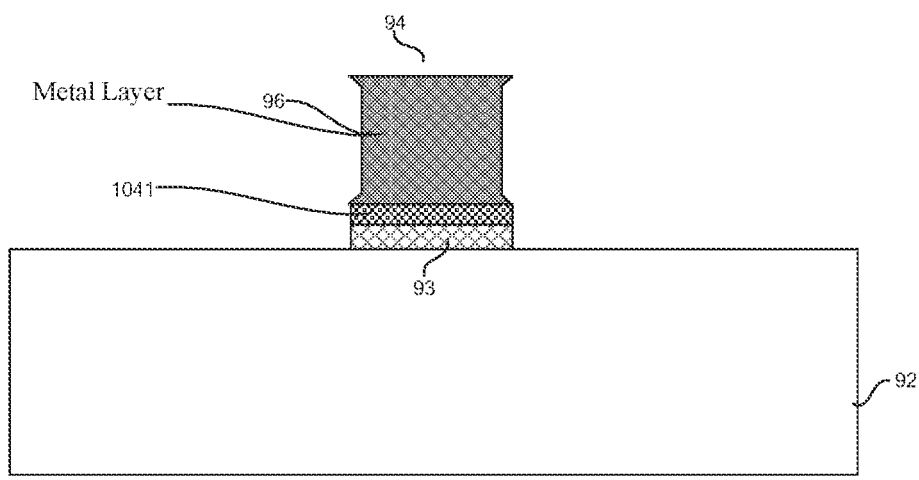
Figure 10E:
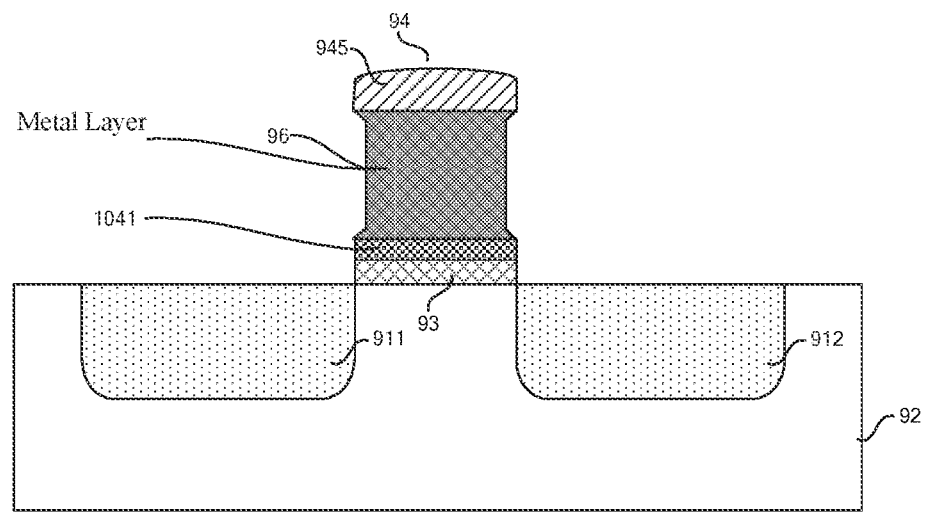
Figure 10F:
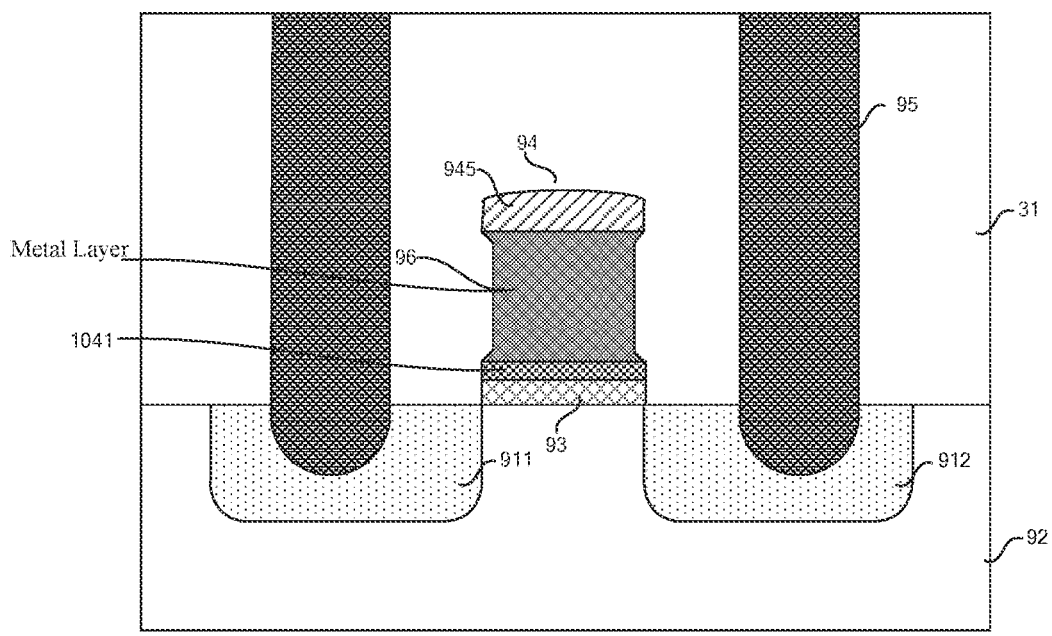

In some embodiments, after Step 101 is performed, a schematic structural diagram of the semiconductor structure is as shown in FIG. 9a, where the substrate is represented by Numeral 92, and the gate oxide layer is represented by Numeral 93. After Step 301 and Step 302 are performed, a schematic structural diagram of the semiconductor structure is as shown in FIG. 10a, where the first dielectric layer is represented by Numeral 1041, and the third conductive layer is represented by Numeral 1042. A schematic structural diagram of the semiconductor structure obtained after Step 303 is performed is as shown in FIG. 10b, where the third conductive layer is a metal layer represented by Numeral 96. A schematic structural diagram of the semiconductor structure obtained after Step 304 is performed is as shown in FIG. 10c, where the gate structure is represented by Numeral 1004. Similarly, in one example, Step 103 may include: etching the currently uncovered gate oxide until the substrate is exposed. Accordingly, a schematic structural diagram of the semiconductor structure obtained after this step is performed is as shown in FIG. 10d. After the gate oxide layer is etched, the source region and the drain region positioned on two sides of the gate structure are formed. Accordingly, a schematic structural diagram of the semiconductor structure obtained after this step is performed is as shown in FIG. 10e, where the source region and the drain region are represented by Numeral 911 and Numeral 912, respectively. The protection layer is represented by Numeral 945 in the figures, and the protection layer may be formed after the gate oxide layer is etched. Accordingly, a schematic structural diagram of the semiconductor structure obtained after Step 104 is performed is as shown in FIG. 10f, where the conductive plug is represented by Numeral 95, and the second dielectric layer is represented by Numeral 31.

Figure 8E:
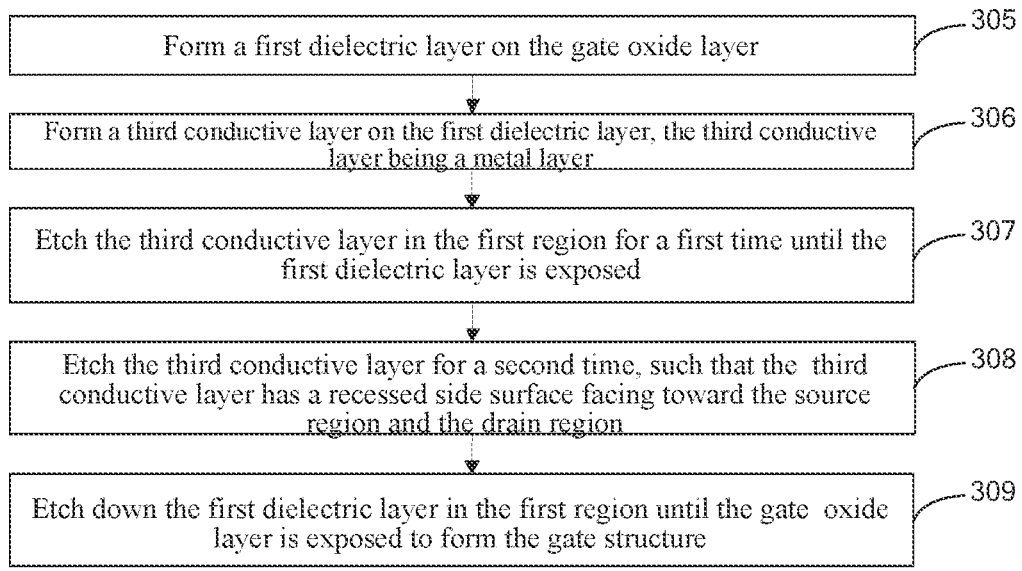

As another embodiment, the gate structure may be obtained by means of the following fabrication method. Correspondingly, as shown in FIG. 8e, Step 102 may include following steps:

Step 305: forming a first dielectric layer on the gate oxide layer;

Step 306: forming a third conductive layer on the first dielectric layer, the third conductive layer being a metal layer;

Step 307: etching the third conductive layer in the first region for a first time until the first dielectric layer is exposed;

Step 308: etching the third conductive layer for a second time, such that the third conductive layer has a recessed side surface facing toward the source region and the drain region; and Step 309: etching down the first dielectric layer in the first region until the gate oxide layer is exposed to form the gate structure.

Figure 10G:
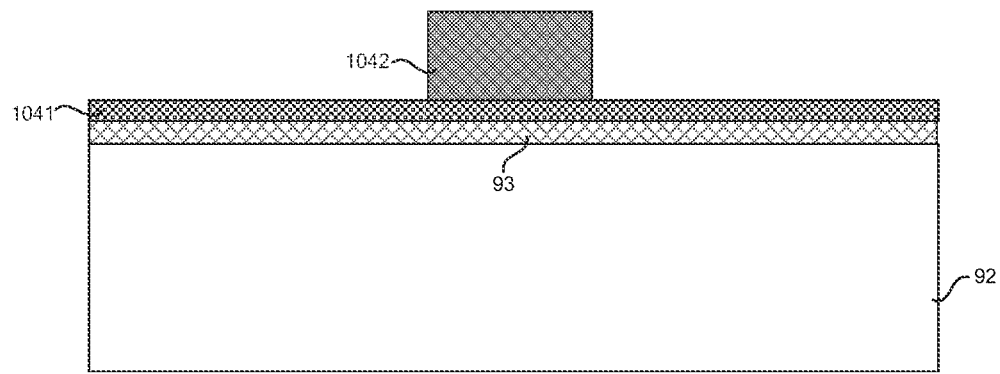

In some embodiments, a structural diagram of the semiconductor structure obtained after Steps 305 to 306 are performed is as shown in FIG. 10a. Compared with the previous embodiment, the main difference lies in that the recessed side surface is formed by means of secondary etching in Step 307 and Step 308. Accordingly, a structural diagram of the semiconductor structure obtained after Step 307 is performed is as shown in FIG. 10g, and a structural diagram of the semiconductor structure obtained after Step 308 is performed is as shown in FIG. 10b. A structural diagram of the semiconductor structure obtained after Step 309 is performed is as shown in FIG. 10c.

In the semiconductor structure provided by this embodiment, the gate structure includes at least one conductive layer having a recessed side surface facing toward the conductive plug. Compared with a traditional gate structure, the distance between the at least one conductive layer of the gate structure and the conductive plug in the present disclosure is increased, thereby reducing the parasitic capacitance between the gate structure and the conductive plug, such that the capacitances between the gate and the source/drain region are reduced, and thus the device characteristics are improved.

Embodiment VI

Figure 11:
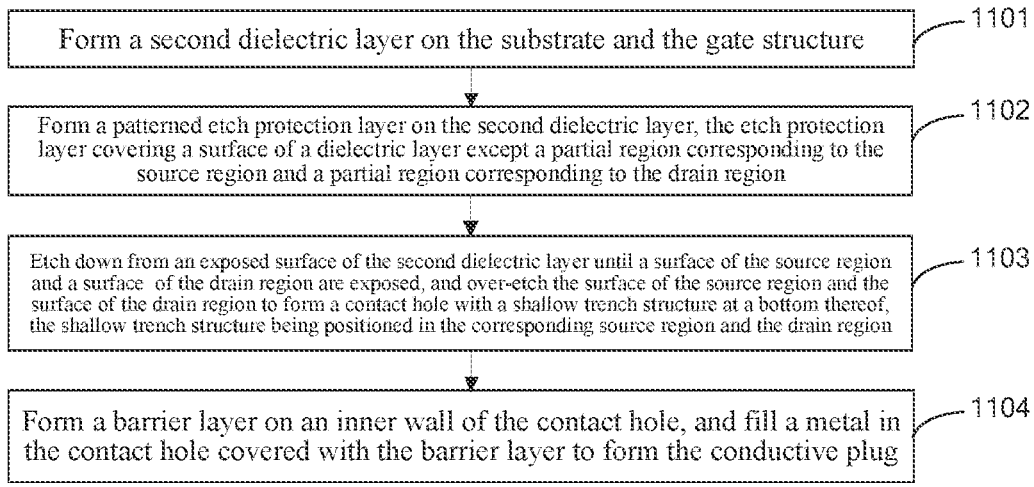
FIG. 11 is a schematic flow diagram of a method for fabricating a semiconductor structure according to Embodiment VI of the present disclosure.

FIG. 11 is a schematic flow diagram of a method for fabricating a semiconductor structure according to Embodiment VI of the present disclosure. This method is used for fabricating the conductive plug of the semiconductor structure. As shown in FIG. 11, based on Embodiment 5, Step 104 includes:

Step 1101: forming a second dielectric layer on the substrate and the gate structure;

Step 1102: forming a patterned etch protection layer on the second dielectric layer, the etch protection layer covering a surface of a dielectric layer except a partial region corresponding to the source region and a partial region corresponding to the drain region;

Step 1103: etching down from an exposed surface of the second dielectric layer until a surface of the source region and a surface of the drain region are exposed, and over-etching the surface of the source region and the surface of the drain region to form a contact hole with a shallow trench structure at a bottom thereof, the shallow trench structure being positioned in the corresponding source region and the drain region; and Step 1104: forming a barrier layer on an inner wall of the contact hole, and filling a metal in the contact hole covered with the barrier layer to form the conductive plug.

In some embodiments, before Step 1104, the method may also include: forming a metal silicide on an inner wall of the shallow trench structure at the bottom of the contact hole. In this embodiment, the metal silicide positioned between the conductive plug and the inner wall of the shallow trench structure may be formed.

An inner and outer multi-layer structure is adopted for the conductive plug provided by this embodiment, which can prevent metal diffusion and thus ensuring the device characteristics of the transistor. Furthermore, by forming the metal silicide on the inner wall of the shallow trench structure, a contact resistance between the conductive plug and the source/drain region can be reduced, and the characteristics of the transistor can be optimized.

Embodiment VII

Figure 12:
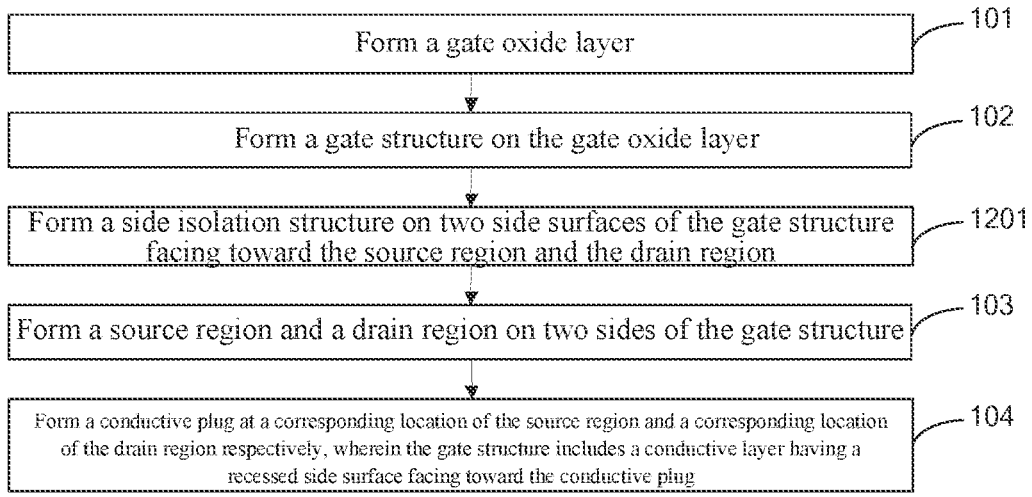
FIG. 12 is a schematic flow diagram of a method for fabricating a semiconductor structure according to Embodiment VII of the present disclosure.

FIG. 12 is a schematic flow diagram of a method for fabricating a semiconductor structure according to Embodiment VII of the present disclosure. This method is used for fabricating a side isolation structure of the semiconductor structure. As shown in FIG. 12, based on Embodiment V or Embodiment VI, after Step 102, the method further includes:

Step 1201: forming a side isolation structure on two side surfaces of the gate structure facing toward the source region and the drain region.

In some embodiments, Step 1201 includes: forming a first isolation sidewall on the side surface of the gate structure facing toward the source region and the drain region; covering an outer wall of the first isolation sidewall with a spacer medium; forming a second isolation sidewall on an outer wall of the spacer medium, wherein a top of the second isolation sidewall extends to a top of the first isolation sidewall to form an enclosed space surrounding the spacer medium. The spacer medium may include, but is not limited to, silicon oxide.

Each part of the side isolation structure may be positioned on the gate oxide layer or the substrate to implement isolation. As another example, the first isolation sidewall is positioned on the gate oxide layer, and the spacer medium and the second isolation sidewall are positioned on the substrate. In corresponding process implementation, the first isolation sidewall may be formed before the gate oxide layer is etched, then the gate oxide layer is etched, and finally the second isolation sidewall is formed. As another example, the first isolation sidewall and the spacer medium are positioned on the gate oxide layer, and the second isolation sidewall is positioned on the substrate. In the corresponding process, the first isolation sidewall and the spacer medium may be formed before the gate oxide layer is etched, then the gate oxide layer is etched, and finally the second isolation sidewall is formed. As yet another example, the first isolation sidewall, the spacer medium, and the second isolation sidewall are all positioned on the gate oxide layer. In the corresponding process, the first isolation sidewall, the spacer medium and the second isolation sidewall may be formed before the gate oxide layer is etched, then the gate oxide layer is etched, and finally the second isolation sidewall is formed. In some embodiments, the step of forming the source and drain regions may be performed after the gate oxide layer is etched.

In some embodiments, Step 1201 includes: forming a third isolation sidewall on side surfaces of the gate structure facing toward the source region and the drain region; covering a third dielectric layer on an outer wall of the third isolation sidewall; forming a fourth isolation sidewall on an outer wall of the third dielectric layer, wherein a top of the fourth isolation sidewall extends to a top of the third isolation sidewall to form an enclosed space surrounding the third dielectric layer; etching the top of the fourth isolation sidewall until a surface of the third dielectric layer is exposed to form an etching hole; etching the third dielectric layer through the etching hole until reaching a surface of the gate oxide layer; and enclosing the etching hole between the top of the fourth isolation sidewall and the top of the third isolation sidewall by means of a rapid deposition process to form an enclosed space filled with air. Similarly, each part of the side isolation structure in this embodiment may also be positioned on the gate oxide layer or the substrate, and reference may be made to the description of the previous embodiment for the related contents, which are not to be repeated here.

In one embodiment, to reduce the short channel effect, the semiconductor structure may further include a lightly doped region positioned on two sides of the gate structure. Accordingly, the fabrication method further comprises: forming a lightly doped region positioned on two sides of the gate structure. In some embodiments, a region of the lightly doped region may be determined according to device design. For example, the lightly doped region is positioned below the first isolation sidewall, or below the first isolation sidewall and the spacer medium, or below the first isolation sidewall, the spacer medium, and the second isolation sidewall. Accordingly, the step of forming the lightly doped region may be performed after the first isolation sidewall is formed, or performed after the first isolation sidewall and the spacer medium are formed, or performed after the second isolation sidewall is formed. However, this embodiment does not limit an execution order of technological processes.

As a process example in combination with the aforementioned embodiment of the protection layer, the step of forming the protection layer may be performed before the side isolation structure is formed, or in practical applications, if the material of the protection layer is the same as that of the isolation sidewall structure, the protection layer may be formed together in the process of forming the side isolation structure, or the protection layer may be formed after the side isolation structure is formed. This embodiment does not limit an execution order of technological processes. That is, the technological processes provided by this embodiment are configured for forming the semiconductor structure in the previous embodiments.

In this embodiment, the side isolation structure is respectively arranged on two sides of the gate structure to prevent occurrence of short circuit between the gate and other components, thereby ensuring good characteristics of the transistor. Consideration is given to a support effect and good stress characteristics.

The present disclosure is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims. The above-mentioned embodiments are merely some embodiments of the present disclosure, but the protection scope of the present disclosure is not limited thereto. Any variation or substitution easily conceivable to a person of ordinary skills in the art within the technical scope disclosed in the present disclosure shall fall within the protection scope of the present disclosure. Therefore, the protection scope of the present disclosure shall be subject to the protection scope of the claims.

What is claimed is:

1. A method for fabricating a semiconductor structure, comprising:
   forming a gate oxide layer;
   forming a gate structure on the gate oxide layer;
   forming a source region and a drain region on two sides of the gate structure; and
   forming a conductive plug at a corresponding location of the source region and a corresponding location of the drain region, respectively;
   wherein the gate structure comprises a conductive layer having a recessed side surface facing toward the conductive plug;
   wherein the forming a gate structure on the gate oxide layer comprises:
   forming a first conductive layer on the gate oxide layer;
   forming a second conductive layer on the first conductive layer, the second conductive layer comprising a plurality of metal layers stacked;
   repeatedly performing following steps until the first conductive layer is exposed: if a current layer exposed in a first region is a predetermined metal layer, performing non-identical isotropic etching on the predetermined metal layer in the first region until a next metal layer is exposed, or etching the predetermined metal layer in the first region for a first time until a next metal layer is exposed and then etching the predetermined metal layer for a second time, such that the predetermined metal layer has a recessed side surface facing toward the source region and the drain region; and if the current layer exposed in the first region is not the predetermined metal layer, etching down the current layer in the first region until a next metal layer is exposed, wherein the first region is a region other than a region between the source region and the drain region; and
   etching down the first conductive layer in the first region until the gate oxide layer is exposed to form the gate structure.

2. A method for fabricating a semiconductor structure, comprising:
   forming a gate oxide layer;
   forming a gate structure on the gate oxide layer;
   forming a source region and a drain region on two sides of the gate structure; and
   forming a conductive plug at a corresponding location of the source region and a corresponding location of the drain region, respectively;
   wherein the gate structure comprises a conductive layer having a recessed side surface facing toward the conductive plug;
   wherein the forming a gate structure on the gate oxide layer comprises:
   forming a first dielectric layer on the gate oxide layer;
   forming a third conductive layer on the first dielectric layer, the third conductive layer being a metal layer;
   performing a non-identical isotropic etching on the third conductive layer in a first region until the first dielectric layer is exposed, such that the third conductive layer has a recessed side surface facing toward the source region and the drain region, wherein the first region is a region other than a region between the source region and the drain region; and
   etching down the first dielectric layer in the first region until the gate oxide layer is exposed to form the gate structure.

3. A method for fabricating a semiconductor structure, comprising:
   forming a gate oxide layer;
   forming a gate structure on the gate oxide layer;
   forming a source region and a drain region on two sides of the gate structure; and
   forming a conductive plug at a corresponding location of the source region and a corresponding location of the drain region, respectively;
   wherein the gate structure comprises a conductive layer having a recessed side surface facing toward the conductive plug;
   wherein the forming a gate structure on the gate oxide layer comprises:
   forming a first dielectric layer on the gate oxide layer;
   forming a third conductive layer on the first dielectric layer, the third conductive layer being a metal layer;
   etching the third conductive layer in a first region for a first time until the first dielectric layer is exposed;
   etching the third conductive layer for a second time, such that the third conductive layer has a recessed side surface facing toward the source region and the drain region; and
   etching down the first dielectric layer in the first region until the gate oxide layer is exposed to form the gate structure.

4. The method according to claim 1, wherein the forming a conductive plug at a corresponding location of the source region and a corresponding location of the drain region comprises:
   forming a second dielectric layer on a substrate and the gate structure;
   forming a patterned etch protection layer on the second dielectric layer, the etch protection layer covering a surface of a dielectric layer except a partial region corresponding to the source region and a partial region corresponding to the drain region;

etching down from an exposed surface of the second dielectric layer until a surface of the source region and a surface of the drain region are exposed, and over-etching the surface of the source region and the surface of the drain region to form a contact hole with a shallow trench structure at a bottom thereof, the shallow trench structure being positioned in the corresponding source region and the drain region; and forming a barrier layer on an inner wall of the contact hole, and filling a metal in the contact hole covered with the barrier layer to form the conductive plug.

5. The method according to claim 4, wherein before the barrier layer is formed on the inner wall of the contact hole, the method further comprises:

forming a metal silicide on an inner wall of the shallow trench structure at the bottom of the contact hole.

6. The method according to claim 1, wherein the forming a gate structure on the gate oxide layer comprises:

forming a gate structure on the gate oxide layer, wherein a top layer of the gate structure is a protection layer.

7. The method according to claim 1, wherein after the gate structure is formed on the gate oxide layer, the method further comprises:

forming a side isolation structure on two side surfaces of the gate structure facing toward the source region and the drain region.

8. The method according to claim 7, wherein the forming a side isolation structure on two side surfaces of the gate structure facing toward the source region and the drain region comprises:

forming a first isolation sidewall on the two side surfaces of the gate structure facing toward the source region and the drain region;

covering a spacer medium on an outer wall of the first isolation sidewall; and forming a second isolation sidewall on the outer wall of the spacer medium, and a top of the second isolation sidewall extending to a top of the first isolation sidewall to form an enclosed space surrounding the spacer medium.

9. The method according to claim 7, wherein the forming a side isolation structure on two side surfaces of the gate structure facing toward the source region and the drain region comprises:

forming a third isolation sidewall on two side surfaces of the gate structure facing toward the source region and the drain region;

covering a third dielectric layer on an outer wall of the third isolation sidewall;

forming a fourth isolation sidewall on an outer wall of the third dielectric layer, and a top of the fourth isolation sidewall extending to a top of the third isolation sidewall to form an enclosed space surrounding the third dielectric layer;

etching the top of the fourth isolation sidewall until a surface of the third dielectric layer is exposed to form an etching hole;

etching the third dielectric layer through the etching hole until reaching a surface of the gate oxide layer; and enclosing the etching hole between the top of the fourth isolation sidewall and the top of the third isolation sidewall by means of a rapid deposition process to form an enclosed space filled with air.

* * * * *